(12) United States Patent
Gomi

(10) Patent No.: US 6,222,250 B1
(45) Date of Patent: Apr. 24, 2001

(54) BIPOLAR TRANSISTOR DEVICE AND METHOD FOR MANUFACTURING THE SAME

(75) Inventor: Takayuki Gomi, Toyko (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/112,230

(22) Filed: Jul. 9, 1998

Related U.S. Application Data

(62) Division of application No. 08/529,213, filed on Sep. 15, 1995, now Pat. No. 5,885,880.

(30) Foreign Application Priority Data

Sep. 19, 1994  (JP) ................................................. P6-223002

(51) Int. Cl.[7] .................................................. H01L 27/082
(52) U.S. Cl. ........................................... 257/574; 257/592
(58) Field of Search ..................................... 438/322, 323, 438/324, 325, 326, 327, 336, 341, 350; 257/569, 574, 575, 576, 592

(56) References Cited

U.S. PATENT DOCUMENTS 4,319,932 * 3/1982 Jambotkar ............................. 148/1.5
4,357,622 * 11/1982 Magdo et al. .......................... 357/44
4,940,671 * 7/1990 Small et al. ............................ 437/31

* cited by examiner

Primary Examiner—Long Pham
Assistant Examiner—William David Coleman
(74) Attorney, Agent, or Firm—Ronald P. Kananen; Rader, Fishman & Grauer

(57) ABSTRACT

A semiconductor device is provided in which a vertical NPN transistor and a vertical PNP transistor electrically isolated from each other are formed on a p-type semiconductor substrate. An n-type buried separating region of the vertical PNP transistor is formed by high-energy ion implantation prior to formation of the $n^+$ type buried collector region of the vertical NPN transistor, and a $p^+$ type buried collector region of the vertical PNP transistor is formed subsequently to formation of an n-type epitaxial layer and a device separating region is formed in the n-type epitaxial layer whereby the thickness of the n-type epitaxial layer is optimized to a required minimum value. A method for producing a semiconductor device is also provided in which a first vertical bipolar transistor of a first conductivity type and a second vertical bipolar transistor of a second conductivity type, electrically isolated from each other, are formed on a semiconductor substrate having a pre-set conductivity type. A buried collector region of the second vertical collector region is formed before formation of a buried collector region of the first vertical transistor.

6 Claims, 39 Drawing Sheets

BIPOLAR TRANSISTOR DEVICE AND METHOD FOR MANUFACTURING THE SAME

This application is a divisional of application Ser. No. 08/529,213 filed Sep. 15, 1995, now U.S. Pat. No. 5,885,880.

BACKGROUND OF THE INVENTION

1. Field of the Invention

This invention relates to a semiconductor device comprised of vertical NPN transistors and vertical PNP transistors formed on one and the same substrate for forming a complementary bipolar transistor, and a method for manufacturing the same. More particularly, it relates to a method for forming a high performance complementary bipolar transistor simply by supplementing a minimum number of steps to the conventional method for manufacturing bipolar transistors.

2. Description of the Related Art

A complementary bipolar transistor, which is a combination of a NPN transistor and a PNP transistor, has been employed up to now in a high-output amplifier stage of an audio equipment as a component of e.g., a push-pull circuit. In a amplifier/detector circuit for intermediate frequency for pictures for UHF television tuner or an LSI for high frequency represented by a signal processing circuit for high-speed communication or optical communication, the tendency is towards realization of a system-on-chip. In keeping up therewith, a there is a demand for a method for manufacturing a complementary bipolar transistor circuit of higher speed and higher integration degree with a smaller number of steps.

FIG. 1 shows a typical construction of a conventional representative complementary bipolar transistor. With the present bipolar transistor, there are formed a vertical NPN transistor (V-NPNTr) and a vertical PNP transistor (V-PNPTr) on one and the same substrate. With V-NPNTr and V-PNPTr, the emitter/base/collector junction is formed along the depth of the substrate, that is in the vertical direction.

In a V-NPNTr portion towards left in FIG. 1, a $n^+$ type buried collector region 3 ($n^+$-BL) is formed in a boundary region between a p-type substrate (p-Sub) 1 and a n-type epitaxial layer 5 (n-EPI) formed thereon. The n-type epitaxial layer 5 has its upper layer portion divided into plural island-like device-forming regions by device separating regions 7 formed by the LOCOS method (selective oxidization separation). A p-type base region 10 and a $n^+$ type collector contact region 9 connecting to the buried collector region 3 are formed on an upper surface portion of the device forming region.

The upper surfaces of the device-forming regions are contacted by three different sorts of contact electrodes formed by polysilicon layers via an interlayer insulating layer 13. That is, the portion of the upper surface facing the base region 10 is contacted by an emitter contact electrode 14E$n$ and a base contact electrode 14B$n$, where the suffix n refers to an NPN transistor. By impurity diffusion from these electrodes, $n^+$ type emitter region 15E$n$ and a $p^+$ type base contact region 15B$n$ are formed within the base region 10. The portion of the upper surface facing the collector region 9 is contacted by a collector contact electrode 14C$n$, and a n type collector contact region 15C$n$ is formed by impurity diffusion from this electrode 14C$n$.

To these contact electrodes 14E$n$, 14B$n$ and 14C$n$, there are connected, via openings formed in the SiO$_2$ interlayer insulating film 16, an emitter electrode 17E$n$, a base electrode 17B$n$ and a collector electrode 17C$n$, each of which is formed by an Al-based multi-layer film.

In a V-PNPTr portion towards right in FIG. 1, an n type buried separating region 2 (N-pocket) for electrically separating the transistor from the substrate and a $p^+$ type buried collector region 4C are formed in this order in a boundary region between the p-type substrate (p-Sub) 1 and the n-type epitaxial layer 5 (n-EPI) formed thereon. On the buried collector region 4C is formed a p-type well 6 by ion implantation into the n-type epitaxial layer. This p-type well 6 has its upper surface layer divided into plural island-like device forming regions by the device separating regions 7 formed by LOCOS (selective oxidative separation). On the surface layer portion of the device forming region, there are formed an n-type base region 11 and a $p^+$ type collector contact region 8C connecting to the $p^+$ type buried collector region 4C.

The upper surface of the device forming region is contacted by three sorts of polysilicon layer contact electrodes via the SiO$_2$ interlayer insulating layer 13. That is, the upper surface portion facing the base region 11 is contacted by an emitter contact electrode 14E$p$ and a base contact electrode 14B$p$, where the subscript p refers to the PNP transistor. By impurity diffusion or ion implantation from these electrodes, the $p^+$ type emitter region 15E$p$ and the $n^+$ type base contact region 15B$p$ are formed in the base region 11. The upper surface portion facing the collector contact region 8C is contacted by the collector contact electrode 14C$p$, and a $p^+$ type collector contact electrode 15C$p$ is formed by impurity diffusion from this electrode 14C$p$.

To these contact electrodes 14E$p$, 14B$p$ and 14C$p$ are connected the emitter electrode 17E$p$, base electrode 17B$p$ and the collector electrode 17C$p$, each formed by Al-based multi-layer films, via openings formed in the SiO$_2$ interlayer insulating film 16, respectively.

The V-NPNTr and the V-PNPTr are separated from each other, as are other devices, not shown, by a $p^+$ type channel stop layer formed on the lower side of the device separating region 7. The channel stop layer is made up of a lower layer side channel stop layer 4ISO and an upper layer side channel stop layer 8ISO stacked back-to-back as an upper tier and a lower tier.

The production process for the above-described complementary bipolar transistor is prolonged and complicated as compared to the production process for the usual bipolar transistor because of the necessity of forming the n-type buried separation layer 2 for electrically separating the $p^+$ buried collector region 4C of the V-PNPTr from the p-type substrate. Since this buried separating region 2 needs to be of the maximum thickness possible and formed at as deep a site in the substrate as possible, it is usually formed in the p-type substrate 1 at the outset by gasphase diffusion of n-type impurities. However, during the drivein of the $n^+$ type buried contact region 3, which represents the severest prolonged high-temperature heat-treatment process of the production process for the complementary bipolar transistor, the buried separating region 2 is diffused upwardly into the inside of the n-type epitaxial layer 5. Consequently, the n-type epitaxial layer 5 needs to be of a certain thickness.

On the other hand, the $p^+$ buried collector region 4C of the V-PNPTr is also responsible for the increased thickness of the n-type epitaxial layer 5. The $p^+$ type buried collector region 4C is usually formed in advance of the n-type epitaxial layer 5. During the epitaxial growth carried out at a temperature of 1000° to 1100° C., the $p^+$ type buried collector region 4C is diffused upwardly by heat diffusion and auto-doping. In addition, the LOCOS step of forming the device separating region in the n-type epitaxial layer is the second severest prolonged high-temperature heat-treatment process of the production process of the complementary bipolar transistor. That is, the n-type epitaxial layer 5 needs to be increased in thickness in order to take into account the fact that the buried collector region 4C undergoes upward diffusion in the course of the LOCOS process.

Thus the n-type epitaxial layer needs to be increased in thickness for improving characteristics of the V-PNPTr. However, this leads to increased size of the collector layer of the V-NPNTr and hence to base-widening effects of Kirk-effects, resulting in lowered cut-off frequency and lowered operating speed.

In addition, with the above-described production process, two ion implantation steps are employed for forming the channel stop layers. This is due to the fact that, since the n-type epitaxial layer 105 needs to be of an increased thickness for the above reason, the device separating region 7 and the single channel stop layer are not effective to separate the two bipolar transistors from each other. The lower layer side channel stop layer 4ISO is formed by the ion implantation process common to that for forming the buried collector layer 4C of the V-PNPTr, while the upper layer side channel stop layer 8ISO is formed by the ion implantation process common to that for forming the collector contact region 8C of the V-PNPTr. However, with the production process for the usual bipolar transistor in which a thin n-type epitaxial layer 5 suffices, there is no necessity of forming the collector contact region 8 of the V-PNPTr because only the collector contact electrode 15Cp formed by impurity diffusion from the collector contact electrode suffices for providing connection between the buried collector region 4C and the collector contact electrode 14Cp. In semiconductor industries, cost reduction is crucial and an increase in the number of steps needs to be avoided at any rate.

OBJECTS AND SUMMARY OF THE INVENTION

It is an object of the present invention to provide a semiconductor device comprised of a high performance complementary bipolar transistor in which an n-type epitaxial layer is prohibited from being increased in thickness and a method for producing the semiconductor device with a minimum increase in the number of process steps as compared to the conventional production process for bipolar transistors.

According to the present invention, there is provided a semiconductor device in which a vertical NPN transistor and a vertical PNP transistor electrically isolated from each other are formed on a p-type semiconductor substrate, wherein an n-type buried separating region of the vertical PNP transistor is formed by high-energy ion implantation prior to formation of the $n^+$ type buried collector region of the vertical NPN transistor, and wherein a $p^+$ type buried collector region of the vertical PNP transistor is formed subsequently to formation of an n-type epitaxial layer thereon and a device separating region formed in the n-type epitaxial layer whereby the thickness of the n-type epitaxial layer is optimized to a required minimum value.

According to the present invention, there is also provided a method for producing a semiconductor device in which a first vertical bipolar transistor of a first conductivity type and a second vertical bipolar transistor of a second conductivity type, electrically isolated from each other, are formed on a semiconductor substrate having a pre-set conductivity type, wherein a buried collector region of the second vertical collector region is formed before formation of a buried collector region of the first vertical transistor. This represents first means for prohibiting the n-type epitaxial layer from being increased in thickness.

The impurity may be introduced into the buried separating region of the second vertical transistor by high energy ion implantation. Such ion implantation is defined as being carried out at an ion accelerating energy of not less than 300 keV and being capable of achieving a projection range of not less than 0.4 μm, depending upon ion species.

Alternatively, the buried collector region of the second bipolar transistor may also be formed after forming the device separating region. This represents second means for prohibiting the n-type epitaxial layer from being increased in thickness.

If the buried collector region of the second vertical bipolar transistor is formed simultaneously during the impurity introducing step for forming a channel stop region of the first vertical bipolar transistor, it becomes possible to suppress the number of process steps to a minimum.

It is also possible to control the impurity profile during the common impurity introducing step by plural ion implantation steps under varying conditions of the ion accelerating energy.

If the first and second means are practiced simultaneously, instead of separately, the n-type epitaxial layer may be prohibited more effectively from being increased in thickness.

In addition, the graft base region of the vertical bipolar transistor and the emitter region and the collector contact region of the second vertical bipolar transistor may also be formed simultaneously by a common impurity diffusion step.

Since the bipolar transistor is usually fabricated on a p-type substrate, it is most preferred with the present invention that a V-NPNTr and a V-PNPTr be formed as the first vertical bipolar transistor and as the second vertical bipolar transistor, respectively. In such case, the n-type buried separating region is formed prior to formation of the $n^+$ type buried collector region of the V-NPNTr. Also the $p^+$ type channel stop region of V-NPNTr and the $p^+$ type buried collector region of the V-PNPTr are formed simultaneously by a common impurity introducing step before or after formation of the n-type buried separating region of V-PNPTr. On the other hand, the $p^+$ graft base region of the V-NPNTr and the $p^+$ type collector contact region of the V-PNPTr are formed simultaneously by the common impurity introducing step.

According to the present invention, the step of forming buried regions of V-PNPTr, which are obstructive to reduction in thickness of the n-type epitaxial layer, is carried out at a stage as late as possible from process steps whose heat treatment conditions are generally thought to be severest in the production process of bipolar transistors, for the purpose of suppressing upward diffusion of the buried V-PNPTr region. Taking an example of a p-type buried semiconductor substrate, the n-type buried separating region of the V-PNPTr is formed on the substrate by high energy implantation technique at back of the $n^+$ type buried collector region of the V-NPNTr, or in recessed parts of the substrate, while the $p^+$ type buried collector region of the V-PNPTr is formed at back of the $p^+$ type buried collector region of the V-PNPTr. However, even if the ion implantation is carried out after the n+ type buried collector region of V-NPNTr, the n-type buried separating region, which in particular needs to be increased in thickness, is preferably formed by introducing ntype impurity by high energy ion implantation with which it is possible to set the projection range in a recessed portion of the p-type semiconductor substrate. Since the buried regions are prohibited in this manner from being diffused to above the n-type epitaxial layer of the buried regions, it becomes unnecessary to set the thickness of the n-type epitaxial layer to a predetermined excess thickness. The result is that, with the semiconductor device produced by this method, the collector region of the V-NPNTr of the smallest possible thickness suffices to suppress the Kirk effect to expedite the operation. In addition, since there is no necessity of providing the channel stop region in an upper layer and a lower layer due to the reduced thickness of the n-type epitaxial layer, it becomes possible to eliminate one ion implantation process.

If the p+ type buried collector region of the V-NPNTr is formed simultaneously during the impurity introducing step for forming the channel stop region of the V-NPNTr, and the p+ graft base region of the V-NPNTr and the p+ collector contact region of V-PNPTr, are formed simultaneously by the common impurity introducing step, it becomes possible to suppress an increase in the number of process steps due to the constitution of the complementary structure to a minimum as compared to the production process for usual bipolar transistors.

Furthermore, if the p+ graft base region of the V-PNPTr and the p+ emitter and collector contact regions of the V-PNPTr are formed simultaneously by a common impurity introducing step, it becomes possible to suppress increase in the number of process steps.

According to the present invention, a complementary bipolar transistor having enclosed therein a V-NPNTr having an integration degree and a high-speed performance comparable to previous values and a V-PNPTr having high speed performance superior to a previous value may be fabricated by simply adding the minimum number of process steps to the conventional production process for bipolar transistors. Consequently, LSIs for high-frequency applications, typified by a picture amplifier/detector circuit for intermediate frequency of a UHF television tuner or a signal processing circuit for high-speed communication or optical communication, may be fabricated without significantly raising the production cost from the current level.

BRIEF DESCRIPTION OF THE DRAWINGS

FIGS. 3A to 3N illustrate a first embodiment of the present invention, wherein FIG. 3A is a schematic cross-sectional view showing the state in which, in the production process for a complementary bipolar transistor according to the present invention, an n-type buried separation region of the V-PNPTr is being formed by ion implantation after forming an n+ type buried collector region of the V-NPNTr on the p-type Si substrate.

FIG. 3N shows the profile of impurity in the V-PNPTr in the complementary bipolar transistor IC.

FIGS. 4A to 4F illustrate a second embodiment of the present invention, wherein FIG. 4A is a schematic cross-sectional view showing the state in the production process for a complementary bipolar transistor according to the present invention in which, in the production process of the complementary bipolar transistor according to the present invention, the n+ type buried collector region for the V-NPNTr and the n-type buried separating region for the V-PNPTr have been formed on the p-type Si substrate, the n-type epitaxial layer has been grown, the device separating region has been formed and the substrate has been planarized in this order.

FIG. 4B is a schematic cross-sectional view showing the state in which, after forming the channel stop region and the buried collector region in the substrate of FIG. 4A, the SiO$_2$ interlayer insulating film has been patterned, on the substrate and the first polysilicon layer has been deposited on the entire substrate surface, after which p-type impurities are being selectively introduced into the first polysilicon layer.

FIG. 4C is a schematic cross-sectional view showing the state in which n-type impurities are selectively introduced into remaining regions of the first polysilicon layer of FIG. 4B.

FIG. 4D is a schematic cross-sectional view showing the state in which each contact electrode is formed by patterning the first polysilicon layer and coated by an SiO$_2$ interlayer insulating film and a resist mask for forming an emitter window has been formed.

FIG. 4E is a schematic cross-sectional view showing the state in which, in the substrate of FIG. 4D, a base region has been formed by ion implantation, an SiO$_2$ film for forming the sidewall has been coated on the entire substrate surface, a graft base region and a collector contact region have been formed by diffusion impurities from the respective contact electrodes and a sidewall has been formed by etch-back of the SiO$_2$ film.

FIG. 4F is a schematic cross-sectional view showing the state in which, on the substrate of FIG. 4E, a second polysilicon layer has been deposited on the entire substrate surface, an emitter region has been formed by diffusion of impurities from the second polysilicon layer, a contact hole has been formed by patterning the SiO$_2$ interlayer insulating film and an upper metallization has been formed.

FIGS. 5A to 5H illustrate a third embodiment of the present invention, wherein FIG. 5A is a schematic cross-sectional view showing the state in the production process of the complementary bipolar transistor according to the present invention in which a base region is being formed by selective ion implantation into a V-PNPTr forming region of a substrate after formation of a channel stop region and the buried collector region of the V-PNPTr.

FIG. 5B is a schematic cross-sectional view showing the state in which, on the substrate of FIG. 5A, an SiO$_2$ interlayer insulating film is being patterned, a first polysilicon is being deposited on the entire substrate surface and p-type impurities are being introduced into the first polysilicon layer.

FIG. 5C is a schematic cross-sectional view showing the state in which, on the substrate of FIG. 5C, an emitter window for the V-NPNTr has been formed and an intrinsic base region and a pedestal region for the V-NPNTr have been formed by ion implantation.

FIG. 5D is a schematic cross-sectional view showing the state in which, after deposition on the substrate of FIG. 5D of a sidewall forming SiO$_2$ film, a graft base region and a collector contact region have been formed by diffusion of impurities from respective contact electrodes, a sidewall has been formed by etch-back of the SiO$_2$ film and a resist mask has been formed for forming an emitter/base window of the V-PNPTr.

FIG. 5E is a schematic cross-sectional view showing the state in which the emitter/base window is being formed by etching the SiO$_2$ interlayer insulating film of FIG. 5E, a second polysilicon layer is being deposited on the entire surface and p-type impurities are being selectively introduced into the V-PNPTr emitter forming region.

FIG. 5G is a schematic cross-sectional view showing the state in which n-type impurities are selectively introduced into remaining regions of the second polysilicon layer of FIG. 5F.

FIG. 5H is a schematic cross-sectional view showing the state in which the second polysilicon layer of FIG. 5G has been patterned, an SiO$_2$ interlayer insulating film has been deposited on the entire substrate surface, and an emitter region of the V-NPNTr and an emitter region and a base region of the V-PNPTr have been formed by annealing.

FIGS. 6A to 6H illustrate a fourth embodiment of the present invention, in which FIG. 6A is a schematic cross-sectional view showing the state in the production process of a complementary bipolar transistor according to the present invention in which, after formation of a channel stop region and a buried collector region on a substrate has been formed, a base region is being formed by selective ion implantation in the V-PNPTr forming region of the substrate.

FIG. 6B is a schematic cross-sectional view showing the state in which a graft base region is being formed by selective ion implantation into a V-PNPTr forming region of the substrate.

FIG. 6C is a schematic cross-sectional view showing the state in which, on the substrate of FIG. 6B, an SiO$_2$ interlayer insulating film is being patterned, a first polysilicon layer is being formed and n-type impurities are being introduced into the first polysilicon layer.

FIG. 6D is a schematic cross-sectional view showing the state in which each contact electrode has been formed by patterning the first polysilicon layer of FIG. 6C, the SiO$_2$ interlayer insulating film has been deposited on the entire substrate surface and a resist mask for forming an emitter window has been formed.

FIG. 6E is a schematic cross-sectional view showing the state in which an emitter window for the V-NPNTr has been formed on the substrate of FIG. 6D and an intrinsic base region and a pedestal region for V-NPNTr have been formed by ion implantation.

FIG. 6F is a schematic cross-sectional view showing the state in which, after deposition on the entire substrate surface of FIG. 6E of an SiO$_2$ for sidewall formation, a graft base region, an emitter region and a collector contact region are being formed by diffusion of impurities from each contact electrode, a sidewall is being formed by etch-back of the SiO$_2$ film, a second polysilicon layer is being formed on the entire substrate surface and n-type impurities are being introduced into the entire surface.

FIG. 6G is a schematic cross-sectional view showing the state in which the second polysilicon layer has been patterned, an SiO$_2$ interlayer insulating film has been deposited and an emitter region of the V-NPNTr has been formed by annealing.

FIG. 6H is a schematic cross-sectional view showing the state in which a contact hole has been formed by patterning the SiO$_2$ interlayer insulating film and an upper layer metallization has been formed.

DESCRIPTION OF THE PREFERRED EMBODIMENTS

Figure 1:
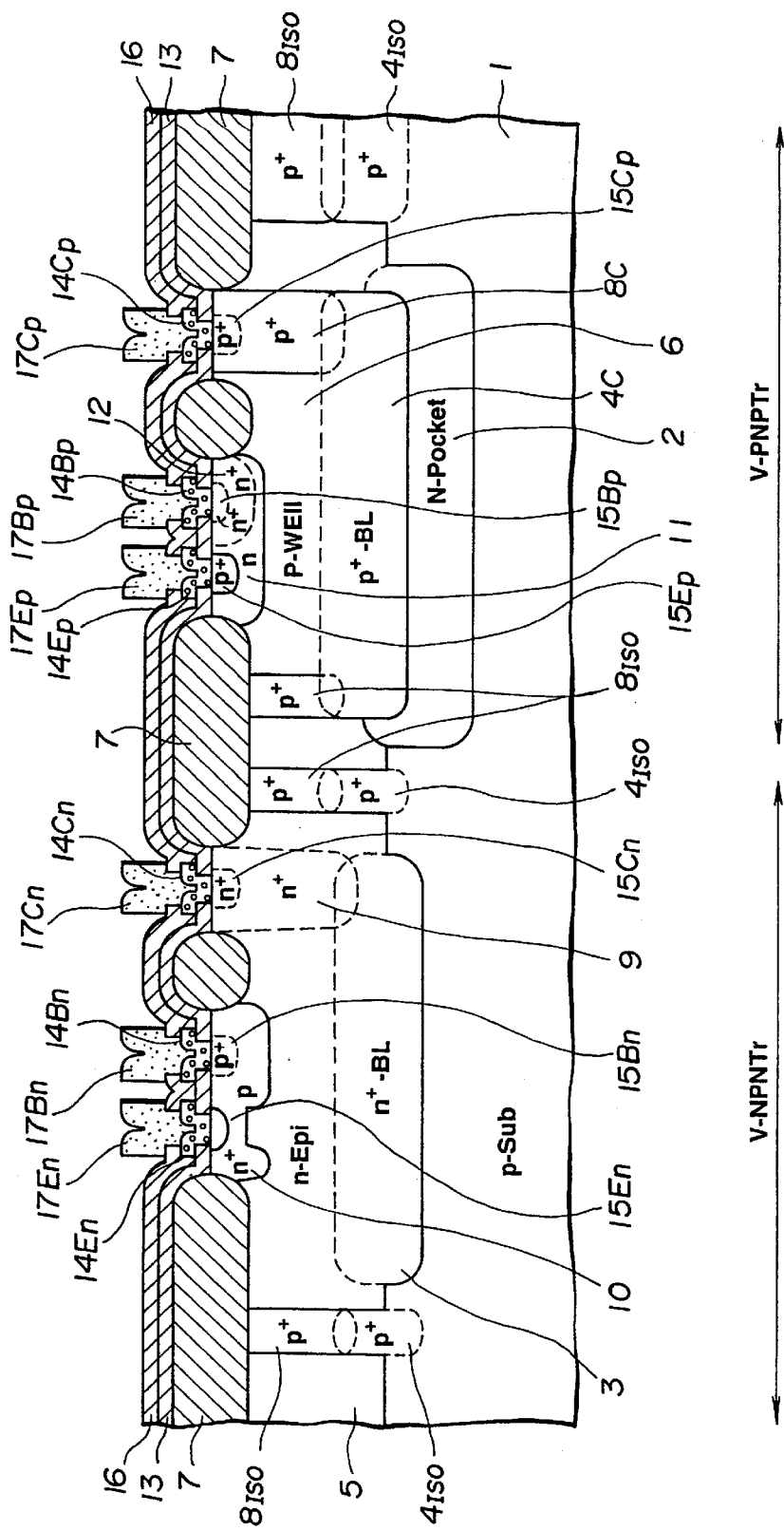
FIG. 1 is a schematic cross-sectional view showing a typical construction of a complementary bipolar transistor produced by the conventional method.

Referring to the drawings, preferred embodiments of the present invention will be explained in detail.

In the first embodiment, a production process for a two-layered silicon vertical bipolar transistor, in which a base region and an emitter region are formed in self-alignment, is utilized for producing a complementary bipolar transistor in which a V-NPNTr and a V-PNPTr are formed in adjacency to each other.

The production process is explained by referring to FIGS. 3A to 3M.

On the surface of a p-type Si substrate 3 having the direction of crystal axes of <111> is formed an $SiO_2$ film, not shown, to a film thickness of approximately 300 nm by thermal oxidation. An opening is formed in a V-NPNTr forming region of the $SiO_2$ film, and antimony (Sb) is diffused via the opening by gas-phase diffusion of $Sb_2O_3$ at approximately 1200° C. for 0.5 to 1 hour. A sheet resistance ρs of the buried collector region 32 was e.g., 20 to 50 Ω/□ and the depth of junction $x_j$ was 1 to 2 μm.

A thin $SiO_2$ film 33, with a thickness of approximately 10 nm, was formed by thermal oxidation on the entire substrate surface for prohibiting channelling, and a resist mask 34 is formed thereon. An opening 35 is formed in the V-PNPTr forming region of the resist mask 34.

Phosphorus (P) was then introduced, with a projection range of not less than 0.4 μm, by high-energy ion implantation via the opening 35, for forming an n-type buried separation region 36. As the conditions for ion implantation, the ion accelerating energy and the dosage were set so as to be not less than 300 keV and equal to $1 \times 10^{13-15}$ cm$^{-2}$, respectively.

Figure 3A:
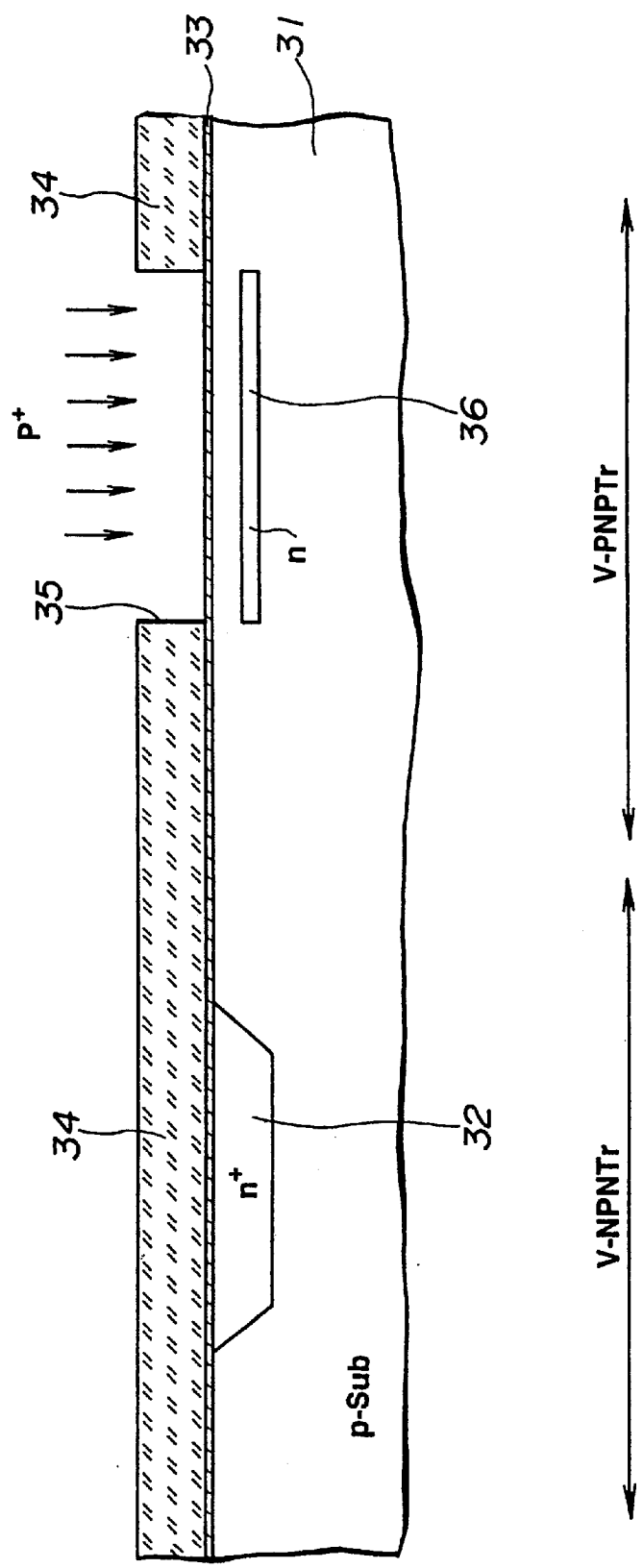

With the conventional production process for usual complementary bipolar transistor, this n-type buried separating region 36 is formed temporally ahead of the n$^+$ type buried collector region 32. This sequence is reversed in the present invention. It is feared that crystal defects may be produced by high energy ion implantation at the time of formation of the buried separating region 36. However, since the crystal defects are generally incurred in the vicinity of the projection range in a concentrated manner, it is not obstructive to subsequent crystal growth. Conversely, the high energy ion implantation has a merit of reducing total dosage to suppress crystal defects as compared to the low-energy ion implantation onto the substrate surface. FIG. 3A shows the process up to this step.

Annealing at a temperature not lower than 800° C. was then carried out in order to relieve crystal defects caused by ion implantation. The n-type buried separating region 36 is expanded at this time due to upward impurity diffusion. However, since the impurity is introduced into deep sites of the substrate, the concentration of impurities in the vicinity of the substrate surface is suppressed to a lower value. This annealing may be omitted if hydrogen annealing is carried out for reducing native oxide film on the surface of the Si substrate 31 as a pre-process to growth of the n-type epitaxial layer 37 now to be explained. This hydrogen annealing is usually carried out in high concentration hydrogen for tens of minutes at 800 to 1100° C.

Figure 3B:
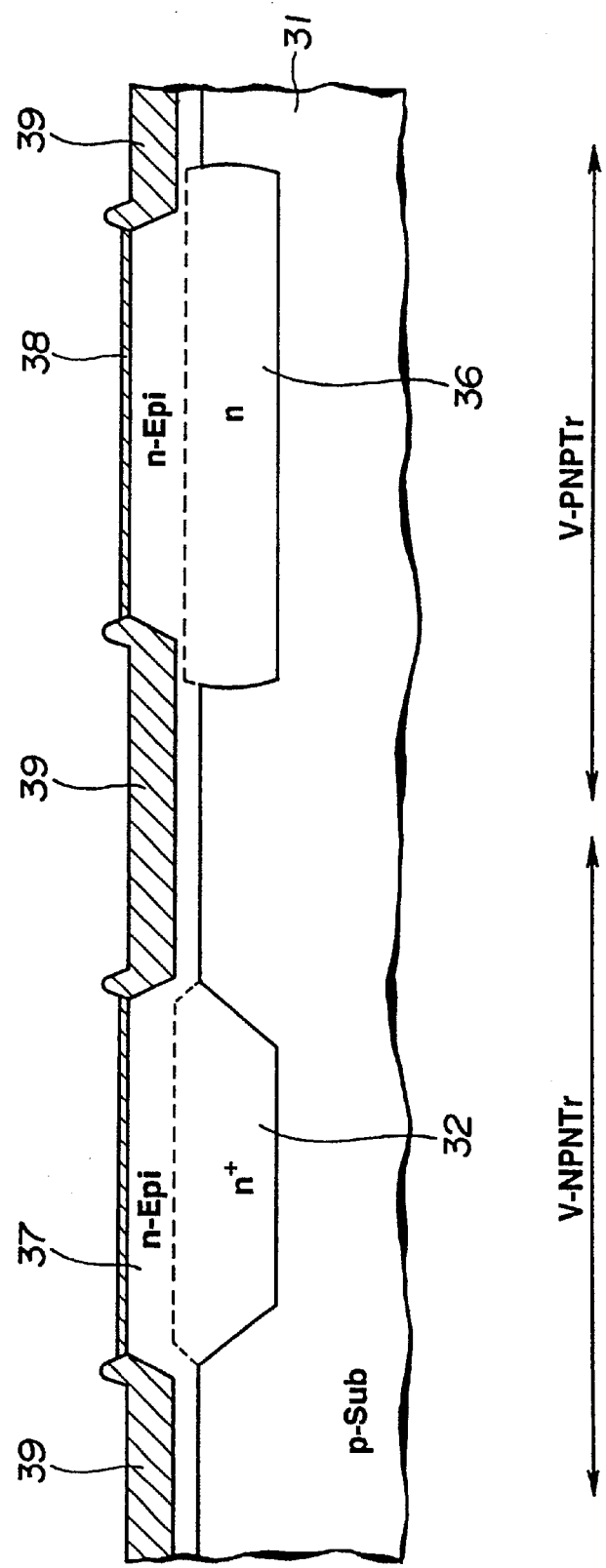
FIG. 3B is a schematic cross-sectional view showing the state in which an n-type epitaxial layer is grown on the Si substrate of FIG. 3A and subsequently a device separating region is formed by the LOCOS method.
Figure 3C:
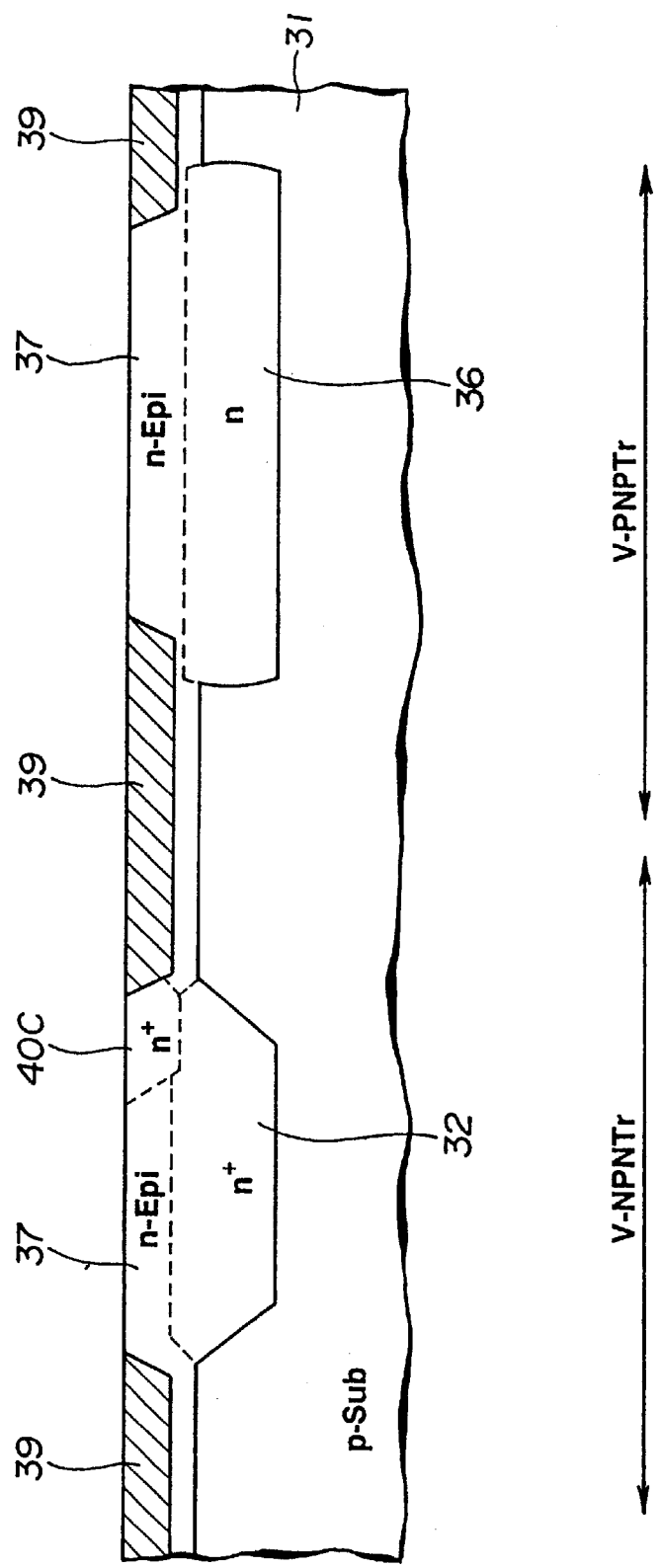
FIG. 3C is a schematic cross-sectional view showing the state in which a collector contact region of the V-NPNTr is formed on the n-type epitaxial layer of FIG. 3B and the substrate surface is planarized.
Figure 3D:
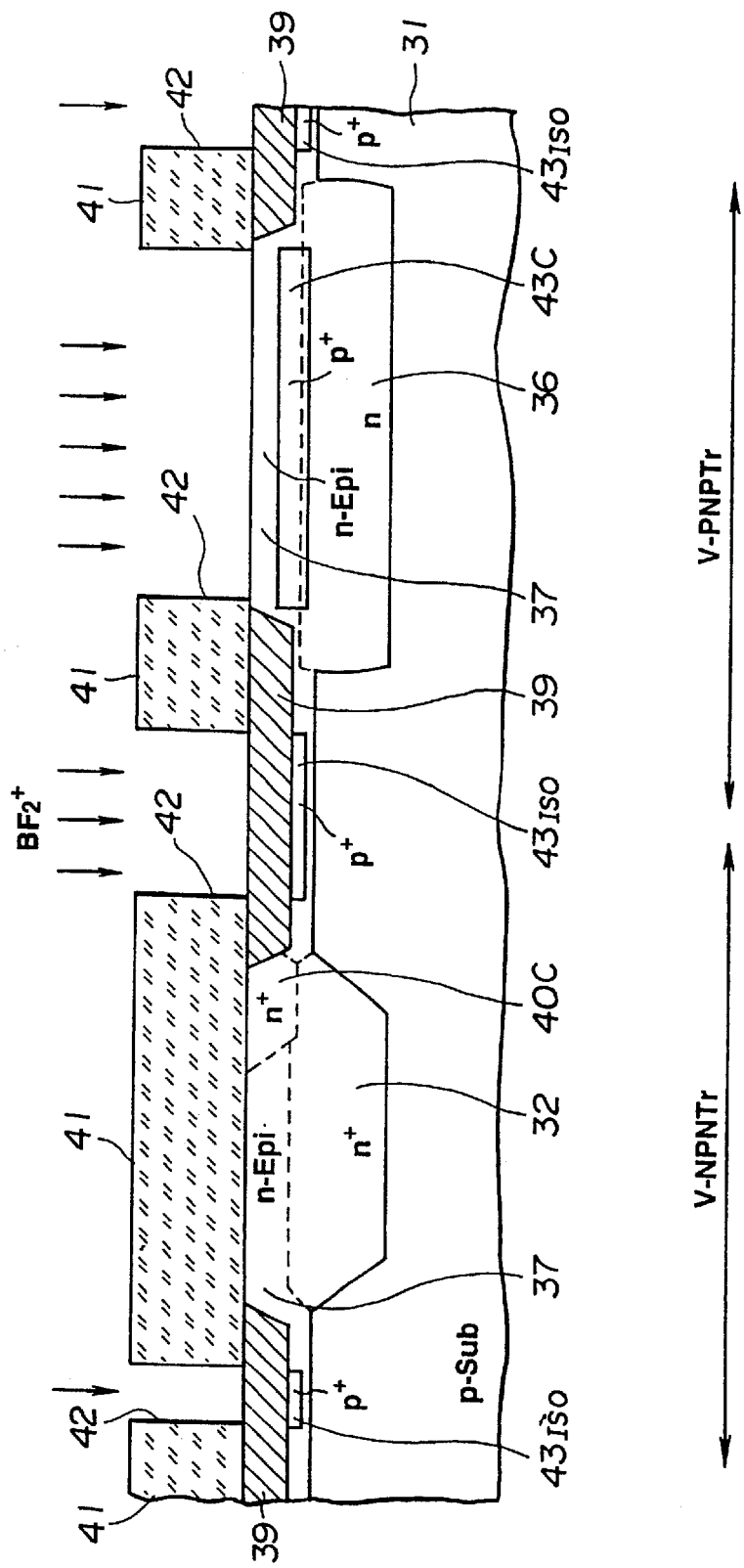
FIG. 3D is a schematic cross-sectional view showing the state in which a channel stop layer of the V-NPNTr and the buried collector region of the V-PNPTr have been formed by ion implantation into the substrate.

The n-type epitaxial layer 37 (n-Epi) was then grown after removal of the $SiO_2$ film 33. This n-type epitaxial layer 37 had a resistivity of 1 to 5 Ω cm and a thickness of 0.8 to 2.5 μm. With the conventional production process for complementary bipolar transistors, since the p$^+$ type buried collector region 43C in FIG. 3D of the V-PNPTr or the channel stop region 43ISO of V-NPNTr of FIG. 3D are formed at the time point of growing the n-type epitaxial layer 37, it was necessary to form the n-type epitaxial layer 37 to a larger thickness in order to take account of upward diffusion therefrom and boron auto-doping. There has also been raised a problem that the concentration of the n-type epitaxial layer 37 cannot be controlled to a design value due to the auto-doping. According to the present invention, the thickness of the n-type epitaxial layer 37 can be approximately one-half the usual value while no problem is raised in connection with auto-doping.

The substrate was then oxidized by the LOCOS method in order to produce a device separating region 39. With the LOCOS method, a pad oxide film was formed as conventionally to a thickness of 20 to 50 nm on the entire surface of the substrate by the thermal oxidation method, and subsequently a $Si_3N_4$ film, not shown, was formed to a thickness of 50 to 100 nm by the reduced-pressure CVD method. These film thicknesses were optimized in consideration of controllability of stress or defect due to selective oxidation or bird's beak length. The $Si_3N_4$ film and the pad oxide film were sequentially etched, using a resist mask, in order to form an oxide mask. The n-type epitaxial layer 37 exposed in the opening of the selectively oxidized mask was further etched for substantially planarizing the substrate surface following selective oxidization for producing a recess. The depth of the recess was set to approximately one-half the design film thickness of the device separating region 39.

Under this condition, pyrogenic oxidation was carried out at 1000 to 1050° C. for 2 to 6 hours for forming the device separating region 39 having a thickness of 0.8 m to 1.5 μm. With the conventional production process for the complementary bipolar transistor, since ion implantation for forming the p$^+$ buried collector of V-PNPTr is already carried out at the time point of oxidation by LOCOS, the impurity is diffused in a wide region under severe heat-treatment conditions. In this consideration, the n-type epitaxial layer 37 has to be formed to a larger thickness. Such precautions are unnecessary in the present invention.

The $Si_3N_4$ was then removed using a hot phosphoric acid solution. FIG. 3B shows the process up to this step.

Then, for forming the n$^+$ type collector contact region of V-NPNTr, phosphorus was ion implanted via a resist mask, not shown. As the conditions for ion implantation, the ion accelerating energy and the dosage were set to 40 to 100 keV and $1 \times 10^{15-16}$ cm$^2$.

An $SiO_2$ film for planarization, not shown, was formed by CVD to a thickness of approximately 10 to 600 nm and annealed for about 30 minutes for impurity activation. By this annealing, an n type collector contact region 40C connecting to the buried contact region 32 was formed.

The resist film, not shown, was coated for substantially planarizing the substrate surface, and the bird's beak and the pad oxide film were removed from the device separating region 39 by carrying out etch-back under the resist film to $SiO_2$ selection ratio of 1:1. FIG. 3C shows the process up to this step.

Then, a thin $SiO_2$ film, having a thickness of 10 to 30 nm, not shown, was formed on the substrate surface by thermal oxidation at 900° C. A resist mask 41 as shown in FIG. 3D was further formed and boron (BF$_2^+$) was ion implanted via an opening 42 formed therein. As the conditions for ion implantation, the ion accelerating energy and the dosage were set to 200 to 500 kev and $1 \times 10^{13-14}$/cm$^2$, respectively. By this ion implantation, a p$^+$ type channel stop region 43ISO of V-NPNTr was formed below the device separating region 39, at the same time as a p$^+$ type buried collector region 43C was formed in a region overlapped with the upper end of the buried separating region 36 of V-PNPTr.

If it is desired to optimize the impurity profile of the buried collector region 43C of V-PNPTr for achieving high-speed operation, low-energy ion implantation with the ion accelerating energy on the order of 100 keV may be carried out before or after ion implantation for compensating the impurity concentration in the base/collector boundary region. The impurity at the time of low-energy ion implantation is captured by the device separating region 39 in the vicinity of the channel stop region 43ISO 4 without affecting separating characteristics. FIG. 3D shows the process up to this step.

On the entire substrate surface, an $SiO_2$ interlayer insulating film 44 was deposited by CVD to a thickness of 50 to 200 nm and dry-etched via a resist mask, not shown, using e.g., a $CHF_3/O_2$ mixed gas for forming an opening. This opening was formed in the base/emitter forming site of V-NPNTr and in the base/emitter forming site and collector forming site of V-PNPTr.

Then, a first polysilicon layer 45 was formed by CVD on the entire substrate surface to a thickness of 100 to 300 nm.

Figure 3E:
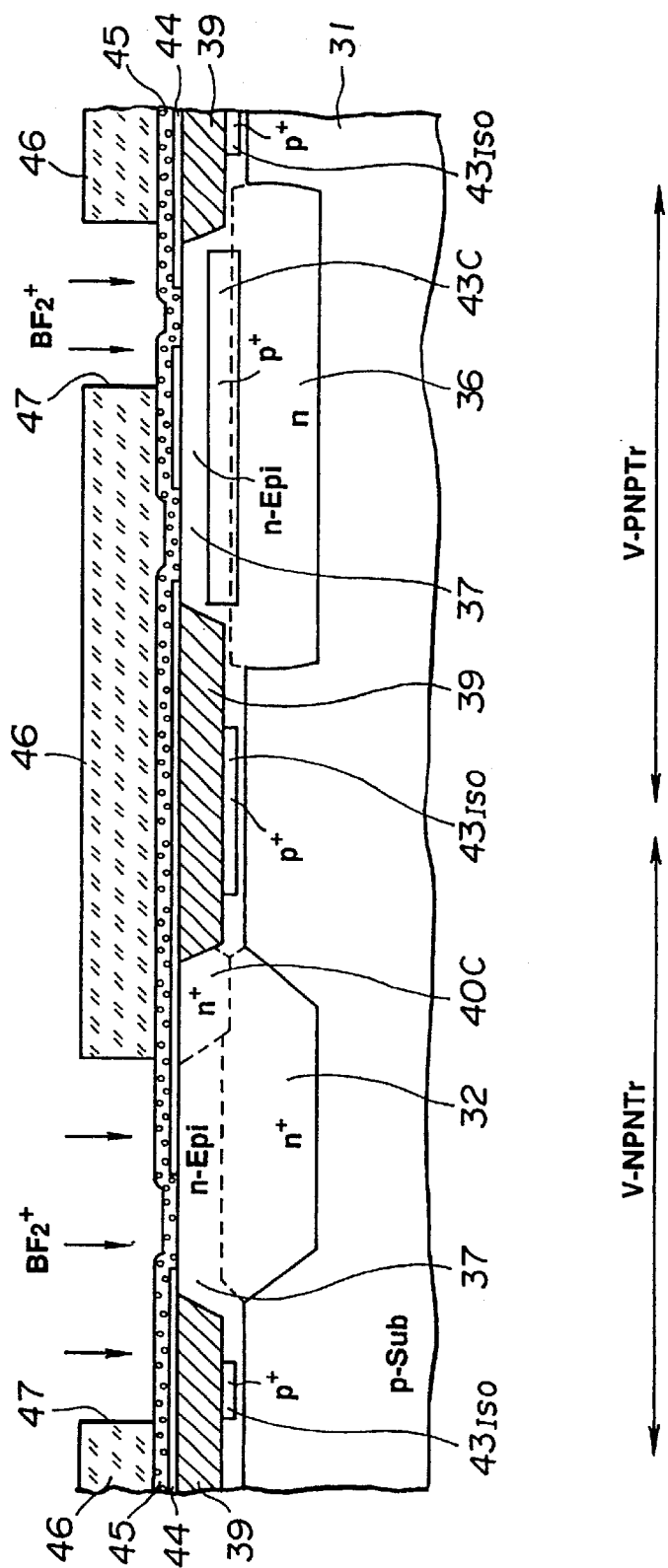
FIG. 3E is a schematic cross-sectional view showing the state in which an $SiO_2$ interlayer insulating layer is being patterned, the first polysilicon layer is being deposited on the entire surface and p-type impurities are selectively introduced into the first polysilicon layer on the substrate of FIG. 3D.
Figure 3F:
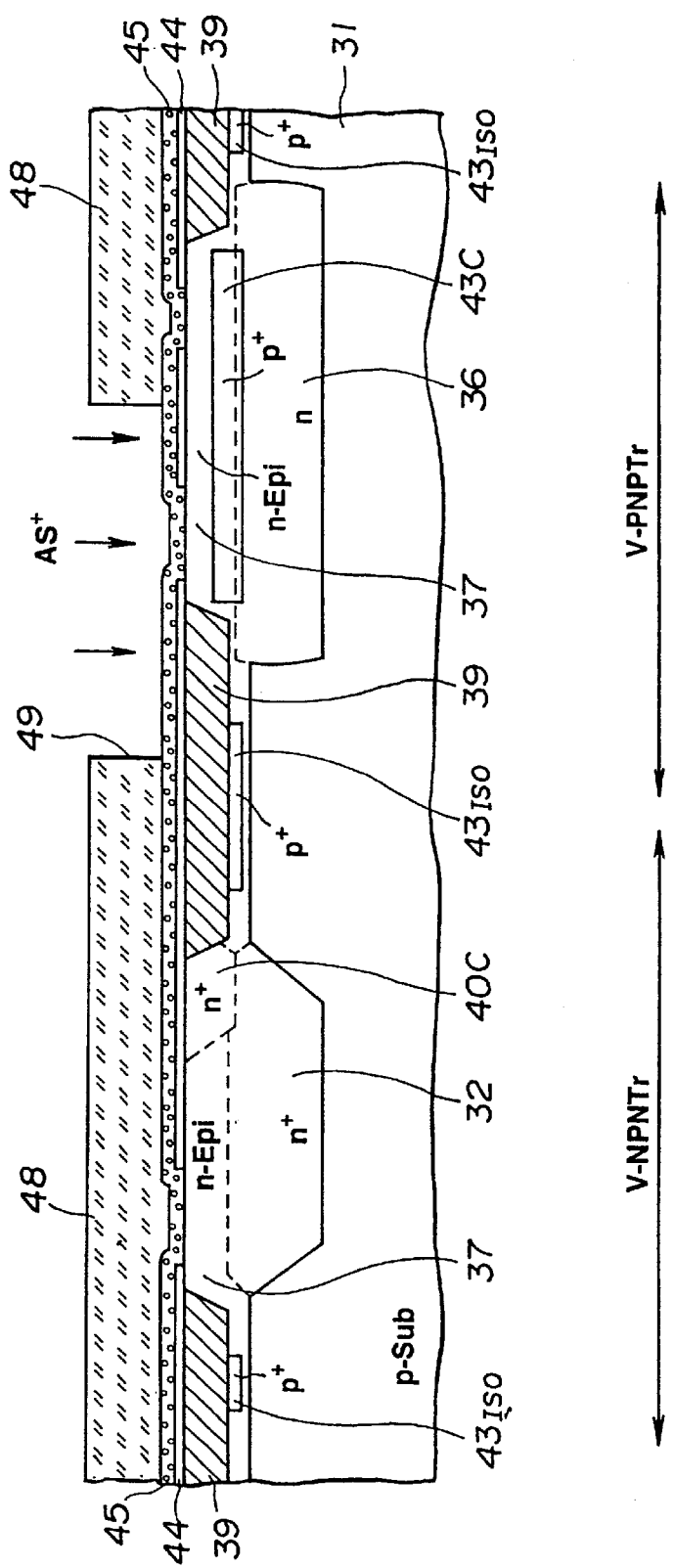
FIG. 3F is a schematic cross-sectional view showing the state in which n-type impurities are being selectively introduced into the remaining regions of the first polysilicon layer of FIG. 3E.

Then, in order for the p-type impurity to be contained in the portions of the first polysilicon layer 45 which later become the base contact electrode of V-NPNTr (45B$n$ of FIG. 3G) and the collector contact electrode of V-PNPTr (45C$p$ of FIG. 3G), a resist mask 46 having an opening 47 for exposing a site slightly larger in area than these sites was formed and boron ($BF_2^+$) was ion implanted via this opening 47. As the conditions for ion implantation, the ion accelerating energy and the dosage were set to e.g., 30 to 70 keV and $1\times10^{14-16}/cm^2$, respectively. FIG. 3E shows the process up to this step.

Then, in order for n-type impurities to be contained in the portion of the first polysilicon layer 45 which later becomes the base contact electrode of V-PNPTr (45B$p$ in FIG. 3G), a resist mask 48 having an opening 49 for exposing a larger area inclusive of the V-PNPTr was formed and arsenic ($As^+$) was ion-implanted via this opening 49. As the conditions for ion implantation, the ion accelerating energy and the dosage were set to e.g., 30 to 70 keV and $1\times10^{14-16}/cm^2$, respectively.

Figure 3G:
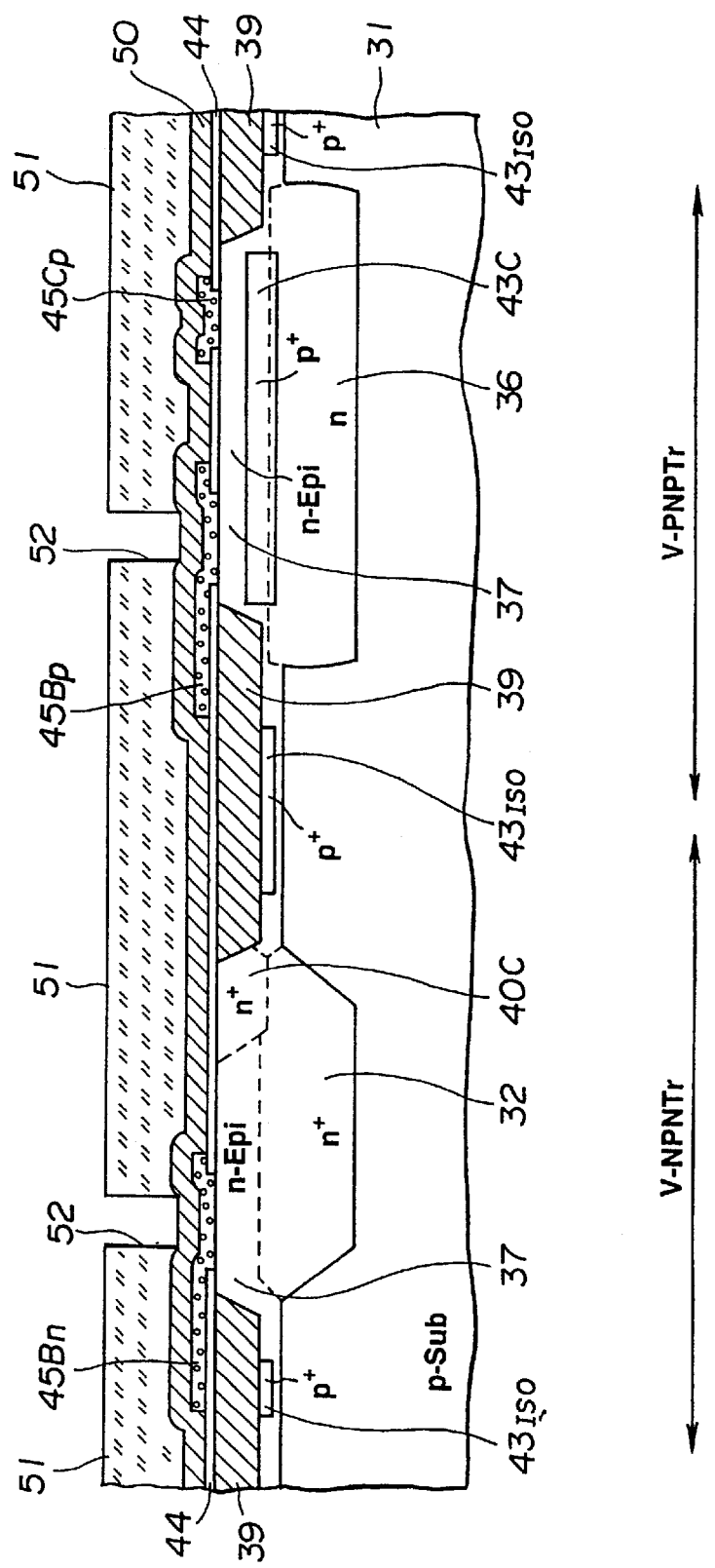
FIG. 3G is a schematic cross-sectional view showing the state in which each contact electrode is being formed by patterning the first polysilicon layer, an $SiO_2$ interlayer insulating film is being deposited on the entire surface of the $SiO_2$ interlayer insulating film and a resist mask is being formed for forming an emitter window.

The first polysilicon layer 45 was then etched via a resist mask, not shown, using e.g., a $C_2Cl_3F_3/SF_6$ mixed gas. In this manner, the base contact electrode 45B$n$ of V-NPNTr and the base contact electrode 45B$p$ and the collector contact electrode 45C$p$ of V-PNPTr were formed, as shown in FIG. 3G. The suffices n and p refer to V-NPNTr and V-PNPTr, respectively.

An interlayer insulating film 50 of $SiO_2$ was further formed on the entire substrate surface to a thickness of 300 to 500 nm for forming a resist mask 51 having openings 52 for forming emitter windows of V-NPNTr and V-PNPTr, respectively.

Figure 3H:
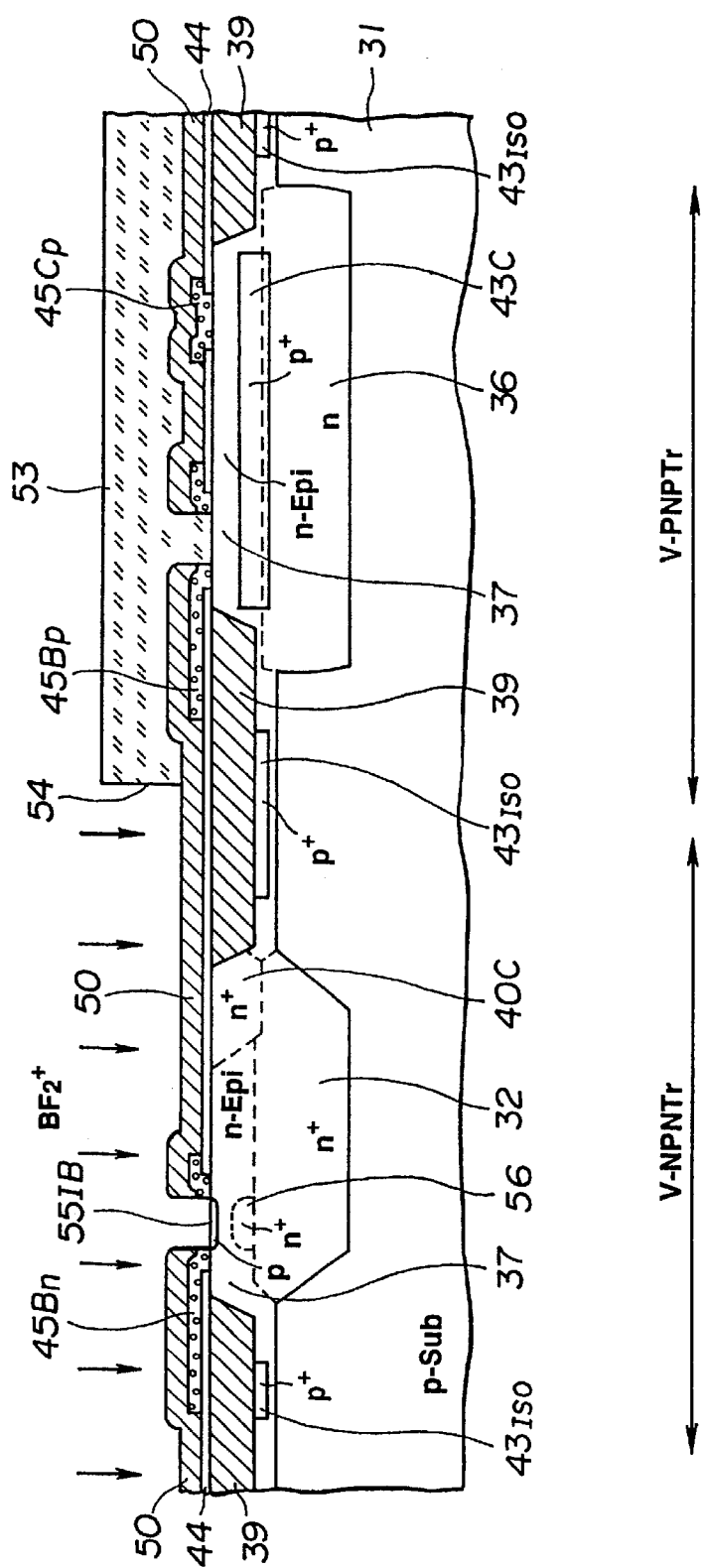
FIG. 3H is a schematic cross-sectional view showing the state in which the emitter window has been opened on the substrate and the base region and the pedestal region of the V-NPNTr have been formed by ion implantation.

The $SiO_2$ interlayer insulating film 50 and the base contact electrode 45B$n$ were sequentially etched via the resist mask 51 for forming emitter windows of V-NPNTr and V-PNPTr, as shown in FIG. 3H. The resist mask was then removed and, after forming a thin $SiO_2$ film, not shown, by thermal oxidation, a resist mask 53 covering only the V-PNPTr forming region was newly formed. By ion-implanting boron ($BF_2^+$) via an opening 54 in the resist mask 53, an intrinsic base region 55IB of V-NPNTr was formed. As the conditions for ion implantation, the ion accelerating energy and the dosage were set to e.g., 20 to 100 kev and $1\times10^{13-14}/cm^2$, respectively.

If it is desired to improve high frequency characteristics of V-NPNTr, it is preferred to introduce phosphorus by ion implantation for forming an $n^+$ type pedestal region 56 adjacent to the upper end of the buried contact region 32. As the conditions for ion implantation, the ion accelerating energy and the dosage were set to e.g., 300 to 500 keV and the order of $1\times10^{12}/cm^2$, respectively.

Figure 3I:
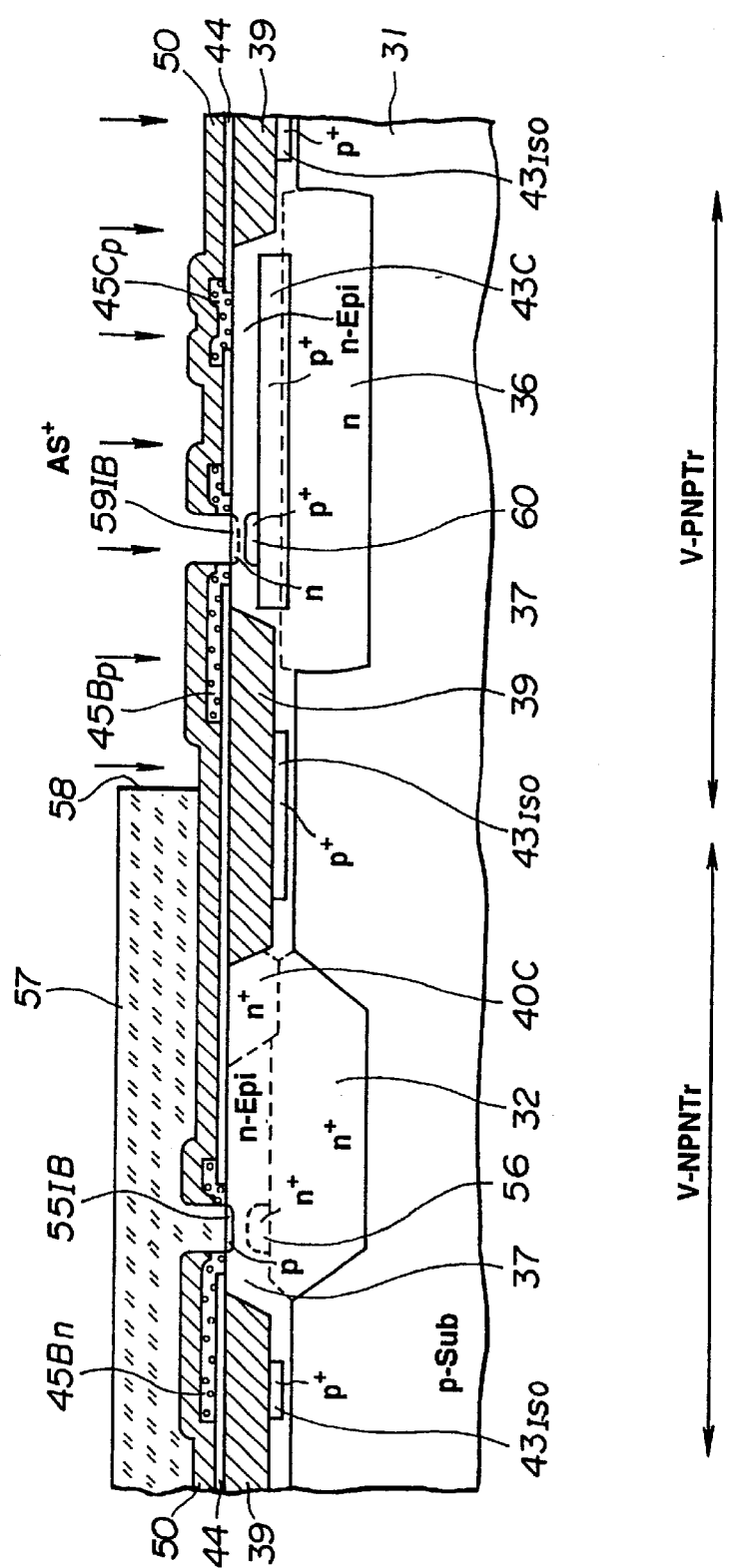
FIG. 3I is a schematic cross-sectional view showing the state in which the base region of V-PNPTr and the pedestal region directly therebelow have been formed by ion implantation into the substrate of FIG. 3H.

Then, as shown in FIG. 3I, a resist mask 57 covering the V-NPNTr forming region was formed and arsenic was ion-implanted via an opening 58 formed therein for forming an n-type intrinsic base region 59IB of V-PNPTr. As the conditions for ion implantation, the ion accelerating energy and the dosage were set to e.g., 20 to 100 keV and $1\times10^{13-14}/cm^2$, respectively.

If it is desired to further improve high-frequency characteristics of V-PNPTr, or if the upper diffused end of the buried separation region 36 reaches the substrate surface beyond the $p^+$ type buried collector region 43C, it is preferred to introduce boron ($B^+$) by ion implantation in succession in order to form a $p^+$ type pedestal region 60 reaching the upper end of the buried collector region 43C. As the conditions for ion implantation, the ion accelerating energy and the dosage may be set to e.g., 300 to 500 keV and $1\times10^{12}/cm^2$, respectively. FIG. 3I shows the process up to this step.

An $SiO_2$ film for sidewall formation was then deposited by CVD on the entire substrate surface to a thickness of 300 to 600 nm and annealing was carried out at 800 to 950° C. for 10 to 60 minutes. By such annealing, the intrinsic base region 55IB was activated in the V-NPNTr forming region, while a $p^+$ graft base region 62GB$n$ was formed by impurity diffusion from the base contact electrode 45B$n$. In the V-PNPTr forming region, the intrinsic base region 59IB was activated, while an $n^+$ type graft base region 62GB$p$ and a $p^+$ collector contact region 62C were simultaneously formed by impurity diffusion from the base contact electrode 45B$p$ and the collector contact electrode 45C$p$, respectively.

By such annealing, the $p^+$ type buried collector region 43C of V-PNPTr was also activated and enlarged. However, the annealing conditions are more moderate than those used for previous oxidation by LOCOS, so that the buried collector region 43C was not diffused upwardly excessively and hence there was no necessity of forming the n-type epitaxial layer 37 to an increased thickness. This represents a difference from the conventional production process for the usual complementary bipolar transistor in which the $p^+$ type buried collector layer 43C is formed prior to oxidation by LOCOS, and hence a merit of the present invention.

Figure 3J:
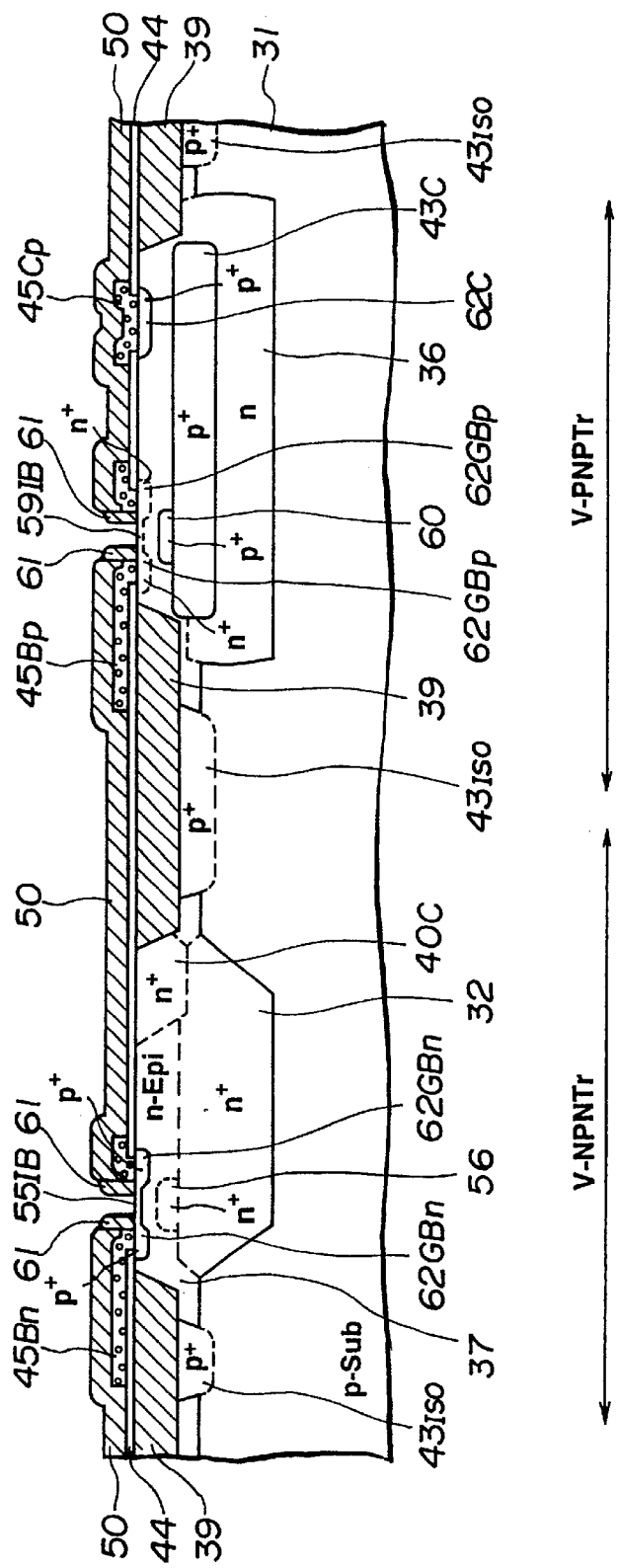
FIG. 3J is a schematic cross-sectional view showing the state in which a graft base region and a collector contact region have been formed by impurity diffusion from the polysilicon film of the respective contact electrodes of FIG. 3I and the sidewall has been formed by etch-back.
Figure 3K:
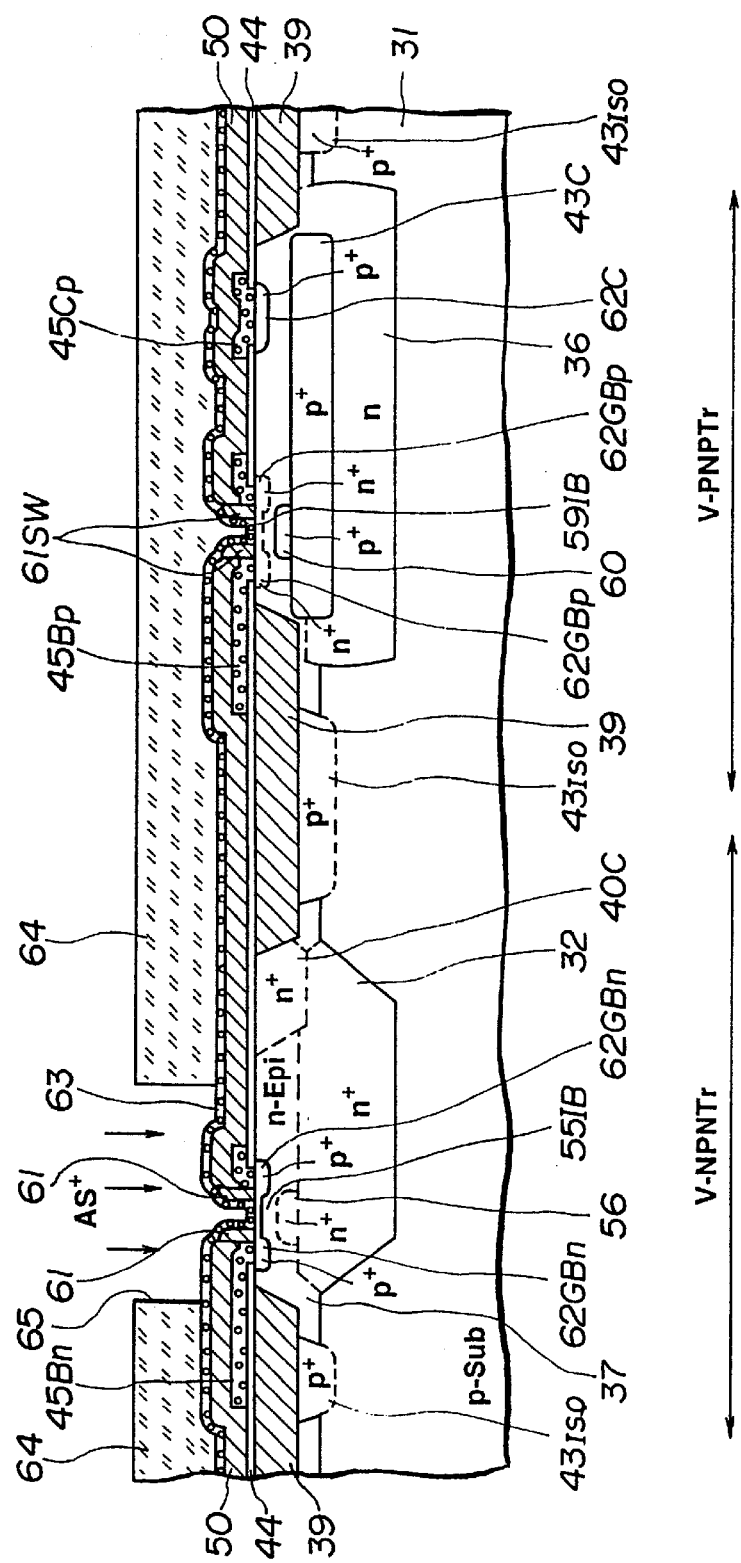
FIG. 3K is a schematic cross-sectional view showing the state in which the second polysilicon layer is being deposited on the entire surface of the second polysilicon layer and n-type impurities are selectively implanted on the substrate of FIG. 3J.

The $SiO_2$ film for sidewall formation was then etched back and a sidewall 61 was formed in the emitter window forming portions of V-NPNTr and V-PNPTr. FIG. 3J shows the process up to this step.

A second polysilicon layer 63 was then deposited by CVD on the entire substrate surface to a thickness of 50 to 200 nm. Then, boron ($BF_2^+$) was ion-implanted via a resist mask, not shown, in a broader area inclusive of the portion of the second polysilicon layer 63 which later becomes an emitter contact electrode 63E$p$ in FIG. 3L of V-PNPTr. As the conditions for ion implantation, the ion accelerating energy and the dosage were set to e.g., 30 to 100 keV and $10\times10^{15-16}/cm^2$, respectively.

Figure 3L:
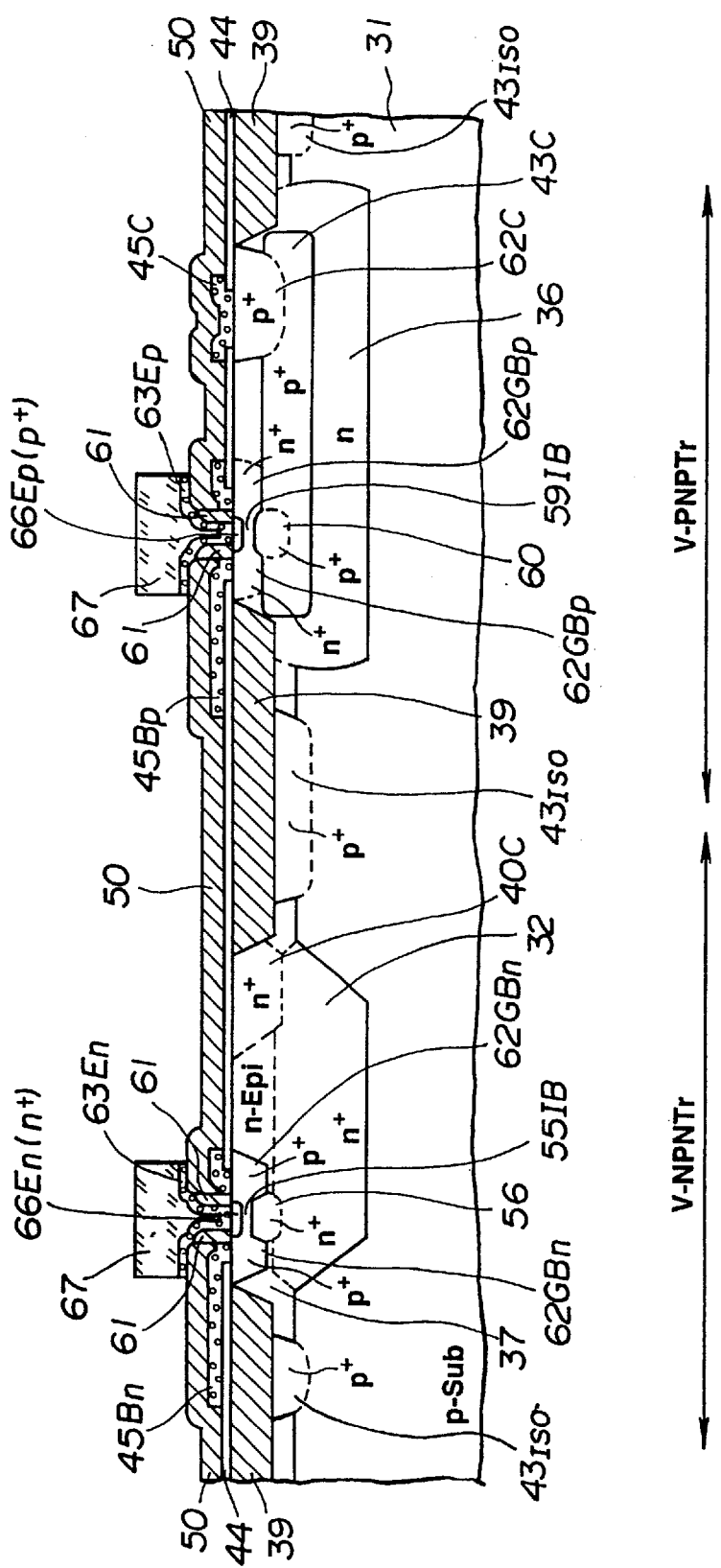
FIG. 3L is a schematic cross-sectional view showing the state in which, after selective ion implantation of n-type impurities into the second polysilicon layer of FIG. 3K, an emitter electrode is formed by patterning and an emitter region is formed by diffusion of impurities.
Figure 3M:
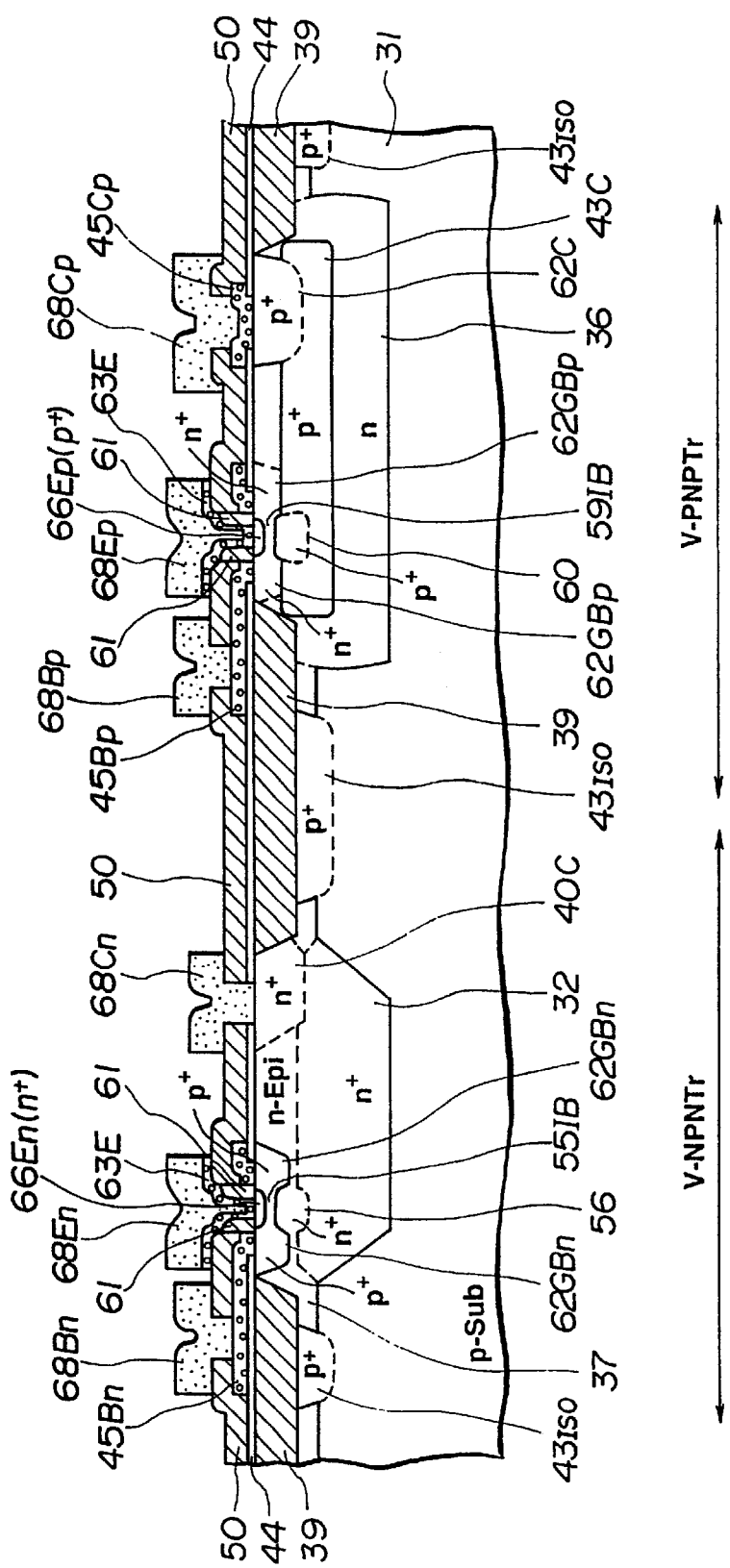
FIG. 3M is a schematic cross-sectional view showing the state in which the $SiO_2$ interlayer insulating film of FIG. 3L has been patterned and an upper metallization has been formed.

Then, arsenic was ion-implanted via an opening 65 in a resist mask 64, in a broader area inclusive of the portion of the second polysilicon layer 63 which later becomes an emitter contact electrode 63E$n$ in FIG. 3L of V-NPNTr. As the conditions for ion implantation, the ion accelerating energy and the dosage were set to e.g., 30 to 100 keV and $1\times10^{15-16}/cm^2$, respectively.

The entire substrate surface was coated with an $SiO_2$ film, not shown, and annealing was carried out at 800 to 950° C. for tens of minutes or at 950 to 1100° C. for several seconds to tens of seconds. By such annealing, an $n^+$ emitter region 66E$n$ and a $p^+$ type emitter region 66E$p$ were formed by n-type impurity diffusion from the emitter contact region 63E*n* in the V-NPNTr forming region and by p-type impurity diffusion from the emitter contact region 63E*p* in the V-PNPTr forming region, respectively. In addition, by such annealing, the collector contact region 62C of V-PNPTr could be enlarged and connected to the $p^+$ type buried collector region 43C.

The $SiO_2$ film was removed by wet etching and a resist mask 67 selectively covering the emitter window portions of both bipolar transistors was formed. The second polysilicon layer 50 was dry-etched via the resist mask 67 for forming the emitter contact electrode 63E*n* of V-NPNTr and the emitter contact electrode 63E*p* of V-PNPTr.

For contacting the electrodes other than the emitter contact electrodes 63E*n* and 63E*p*, that is respective contact electrodes 45B*n*, 45B*p* and 45G*p*, and the collector contact electrode 40C of V-NPNTr, with the upper layer metallization, contact holes were formed in the $SiO_2$ interlayer insulating film 50 and optionally in the $SiO_2$ interlayer insulating film 44 by dry etching using a resist mask, not shown. This resist mask was then removed and a layered metallization film of barrier metal and Al-1% Si film were deposited by sputtering on the entire substrate surface. The metallization film was then patterned to form a base electrode 68B*n*, an emitter electrode 68E*n* and a collector electrode 68C*n* of V-NPNTr and a base electrode 68B*p*, an emitter electrode 68E*p* and a collector electrode 68C*p* of V-PNPTr.

A complementary bipolar transistor IC was then fabricated by carrying out usual process steps including multi-layer metallization and passivation.

Figure 2:
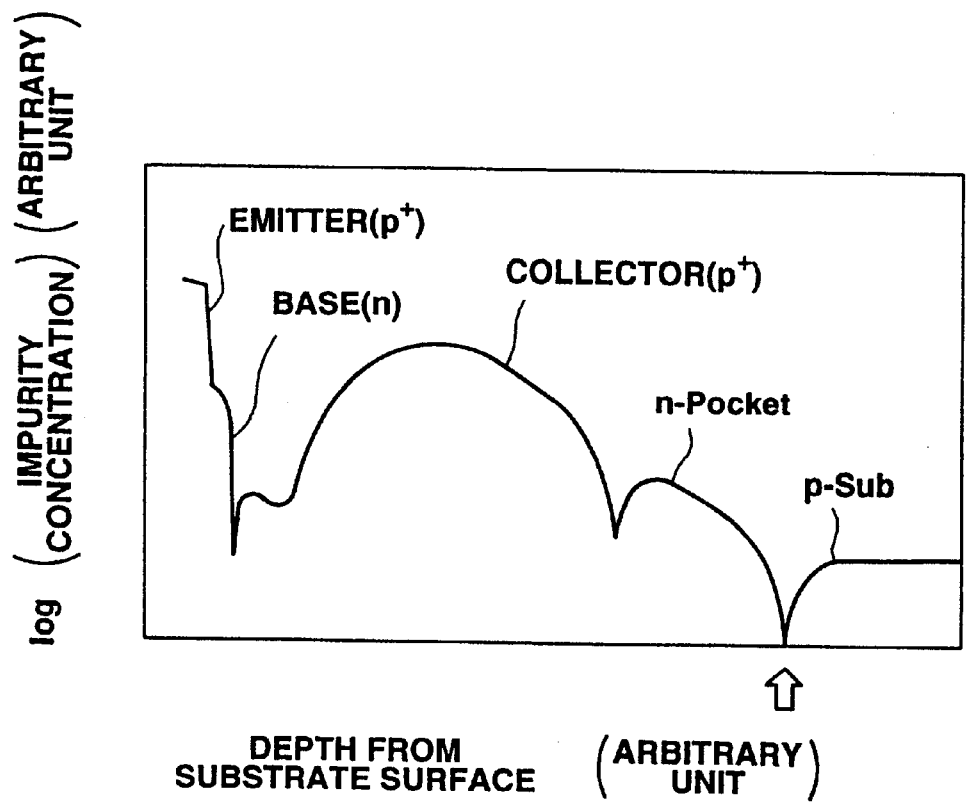
FIG. 2 shows the profile of impurity in the V-PNPTr in the conventional complementary bipolar transistor.
Figure 3N:
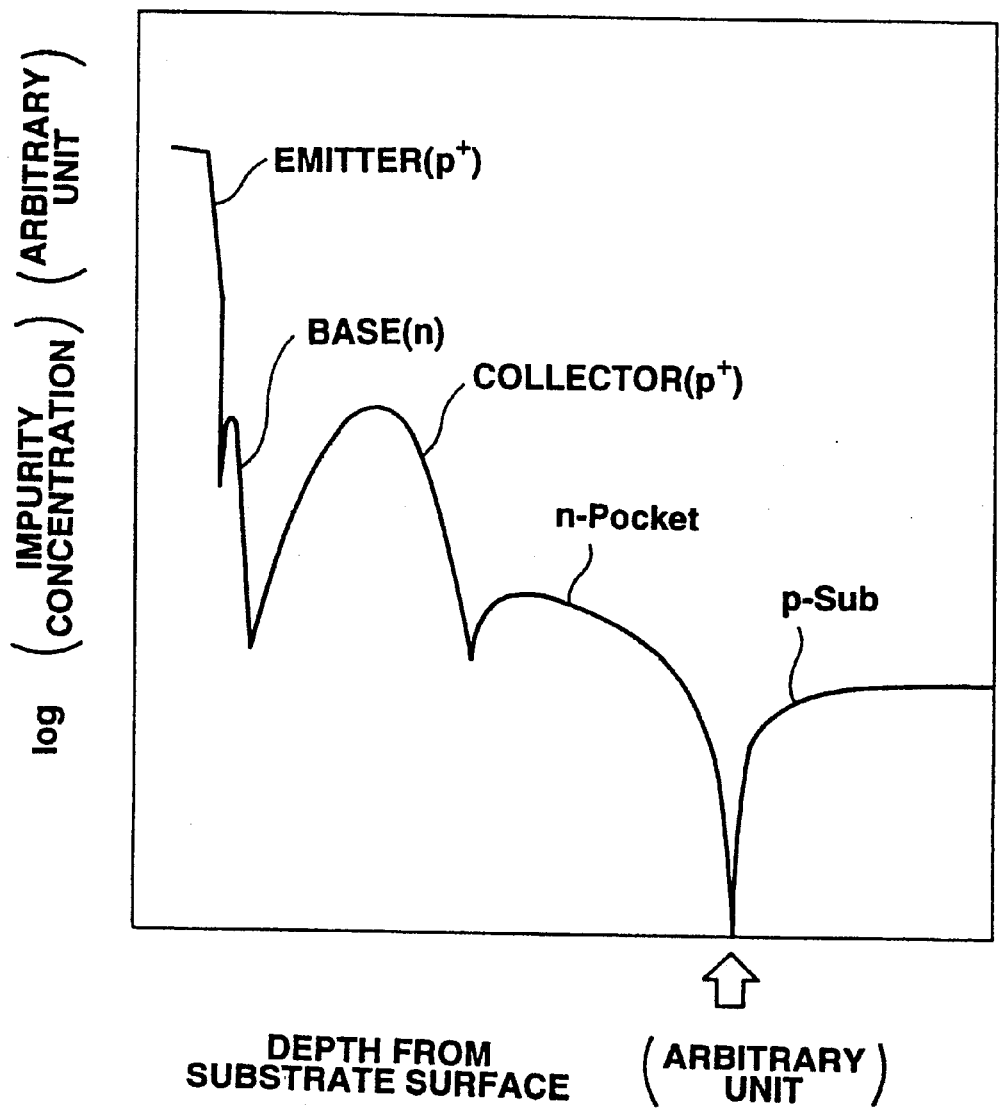

FIG. 3N shows an impurity profile of the V-PNPTr portion of the IC produced as described above. For comparison sake, FIG. 2 shows an impurity profile of the V-PNPTr portion of the conventional complementary bipolar transistor shown in FIG. 1. Heretofore, the total depth of the transistor, that is the depth as measured from the substrate surface (the surface of the n-type epitaxial layer) up to the lower end of the n-type buried separation region (n-pocket) indicated by an arrow is as large as 8.68 $\mu$m, whereas it is decreased with the present invention to approximately 2.50 $\mu$m which is less than 30% of the conventional value. The most outstanding contribution factor in this reduction is the reduction in the collector thickness. This is due to the fact that, since the $p^+$ type buried collector region 43C in the present invention is formed subsequently to the formation of the n-type epitaxial layer 37 and the device separating region 39 without undergoing severe heat treatment caused by epitaxial growth or oxidation by LOCOS thus suppressing upward diffusion towards the n-type epitaxial layer 37. The next contributing factor is thickness of the substrate separation. This is due to the fact that the n-type buried separation region 36 in the present invention is formed subsequently to formation of the $n^+$ type buried collector region 32 of V-NPNTr without undergoing severe drive-in process thus again suppressing upward diffusion towards the n-type epitaxial layer 37.

By suppressing the upward diffusion, the thickness of the n-type epitaxial layer 37 is reduced to one half the conventional value for significantly improving high-frequency characteristics of the complementary bipolar transistor.

The second embodiment of the present invention is now explained.

In the present embodiment, the first polysilicon layer is left in the region of the substrate directly contacted by the upper layer metallization in the first embodiment, that is the collector contact region of V-NPNTr, for forming a collector contact region, while the phosphorus ion implantation step for forming the $n^+$ type collector contact region is omitted. The production process for the complementary bipolar transistor IC of the present embodiment is now explained by referring to FIGS. 4A to 4F. The parts in common with those of the previous embodiment are explained only briefly, while the substrate or layers which are the same as those of the previous embodiment are depicted by the same numerals.

Figure 4A:
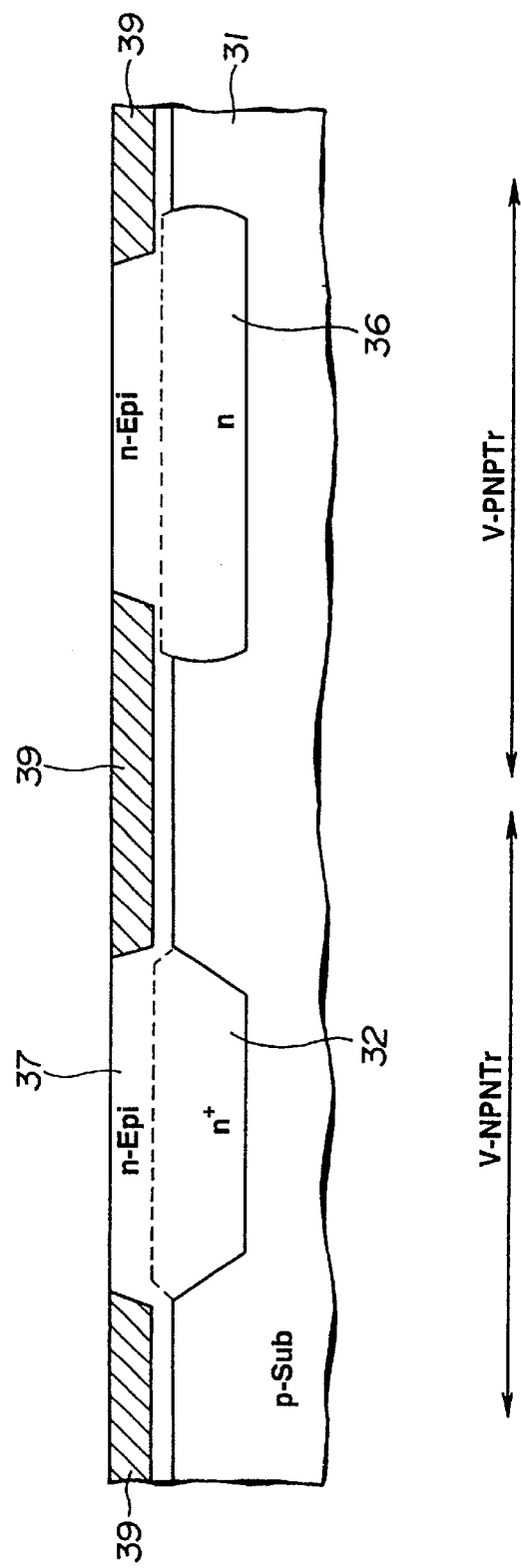

With the present process, formation of the $n^+$ buried collector region 32, n-type buried separating region 36, n-type epitaxial layer 37 and the device separating region 39 by the LOCOS method and substrate surface planarization were carried out in the same way as in the previous embodiment, as shown in FIG. 4A. However, in the above-described process steps, the ion implantation step for forming the collector contact region of V-NPNTr, shown at 40C in FIG. 3C, is omitted.

Figure 4B:
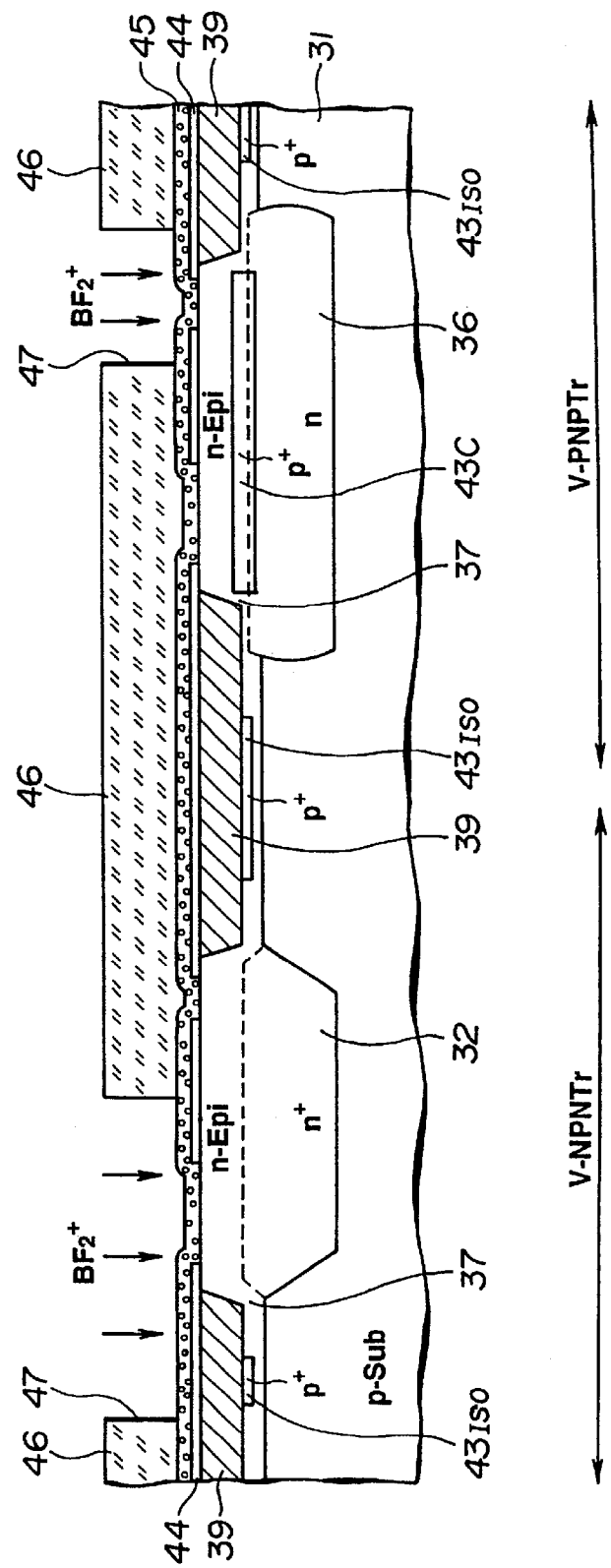

Then, as shown in FIG. 4B, the channel stop layer 43ISO of V-NPNTr and the $p^+$ buried collector region 43C of V-PNPTr were formed by ion implantation of boron, and the $SiO_2$ interlayer insulating film 44 was deposited on the entire substrate surface and patterned. The first polysilicon layer 45 was deposited on the entire substrate surface and p-type impurities were introduced into the first polysilicon layer 45 via the opening 47 in the resist mask 46, as in the first embodiment. During patterning of the $SiO_2$ interlayer insulating film, a window was also formed in the collector contact region of V-NPNTr for contacting the first polysilicon layer 45 with the n-type epitaxial layer 37.

Figure 4C:
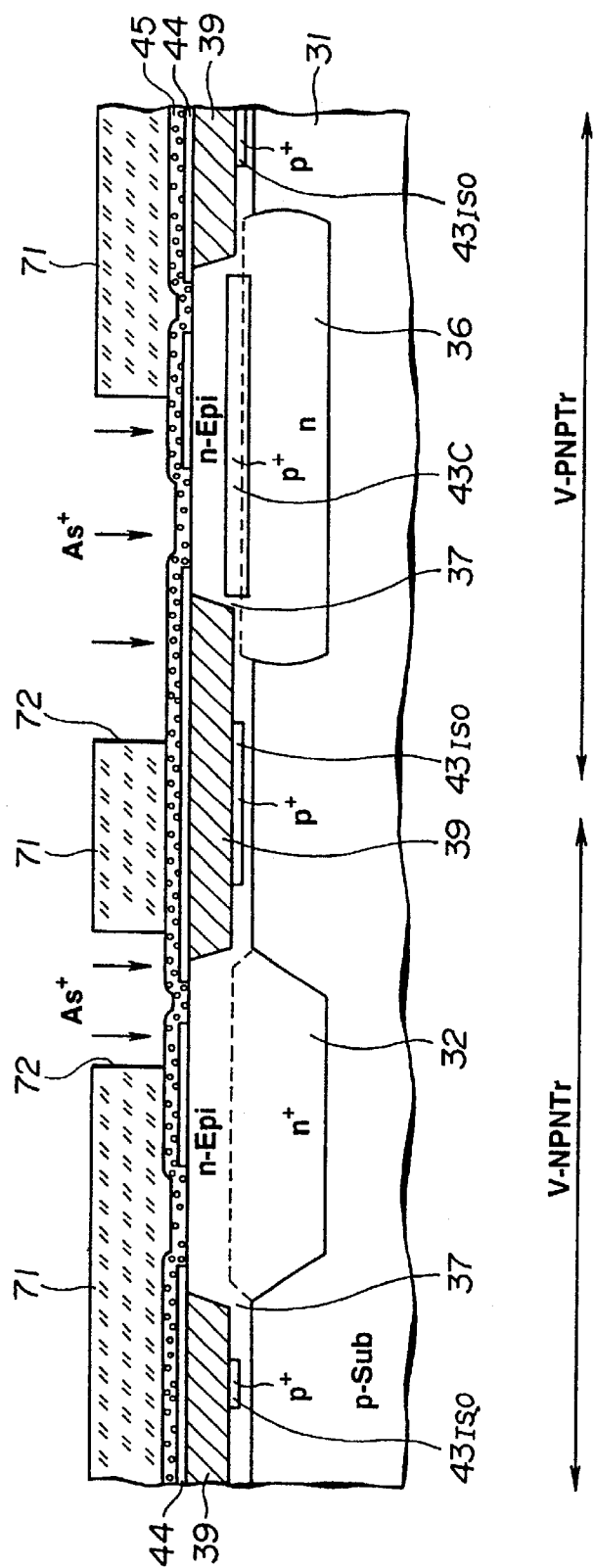

The, as shown in FIG. 4C, another resist mask 71 was formed and arsenic was ion-implanted via an opening 72 in a resist mask 71. The n-type impurity was ion-implanted not only into the base-emitter forming region of V-PNPTr but also into the collector contact region of V-NPNTr, in a manner distinct from the previous embodiment.

Figure 4D:
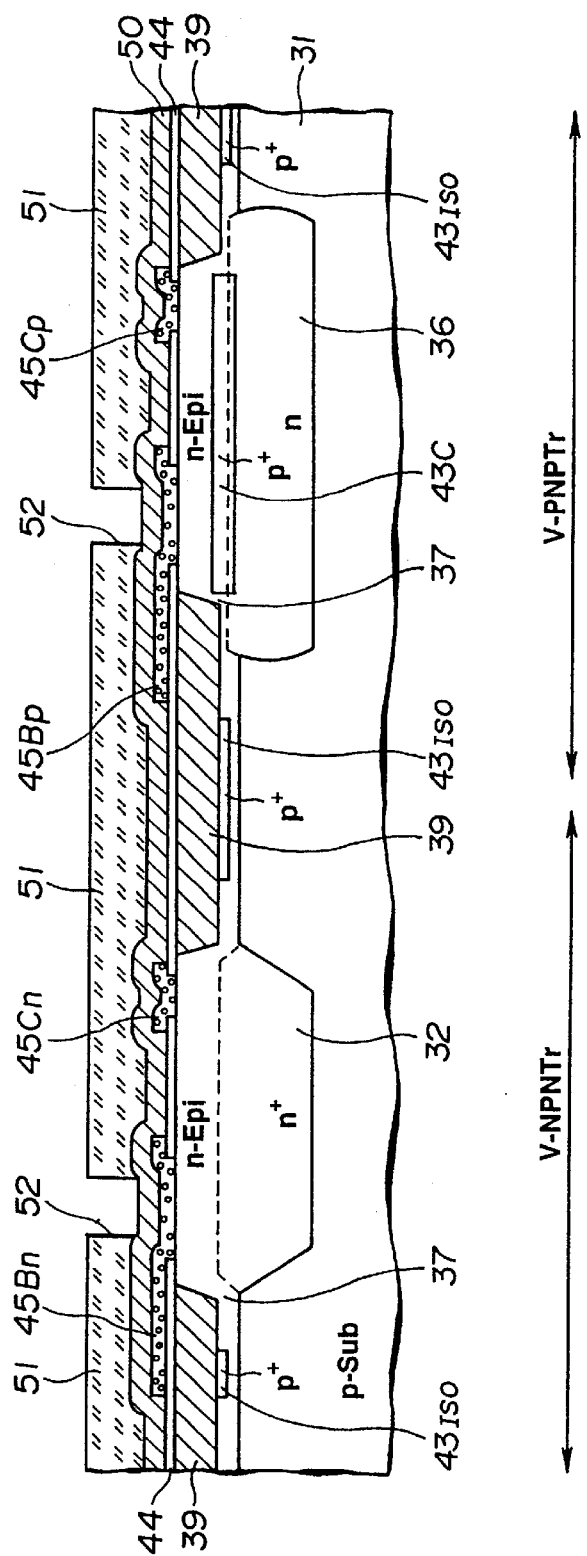

The first polysilicon layer was then patterned for forming the base contact electrode 45B*n* and the collector contact electrode 45C*n* of V-NPNTr and the base contact electrode 45B*p* and the collector contact electrode 45C*p* of V-PNPTr as shown in FIG. 4D. The collector contact electrode 45C*n* of V-NPNTr is a contact electrode not formed in the previous embodiment.

Figure 4E:
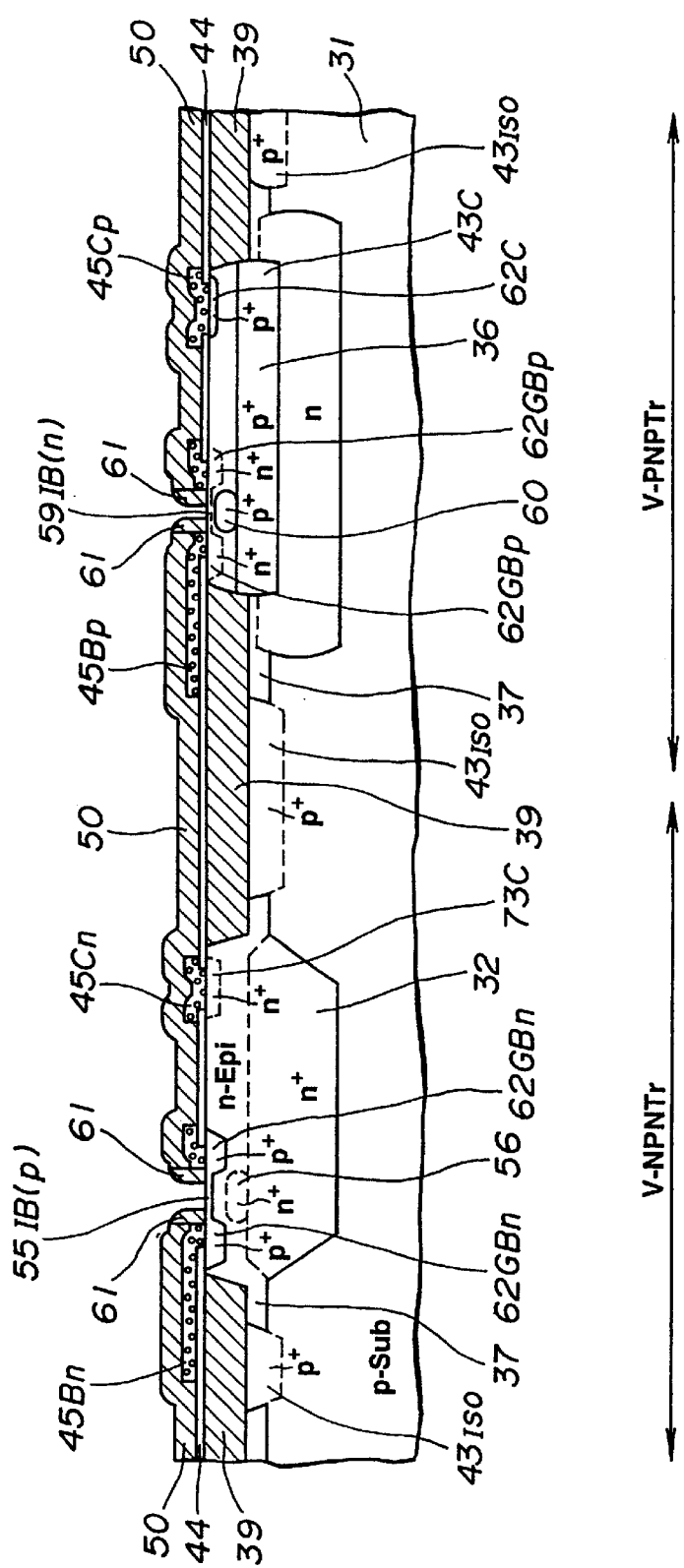
Figure 4F:
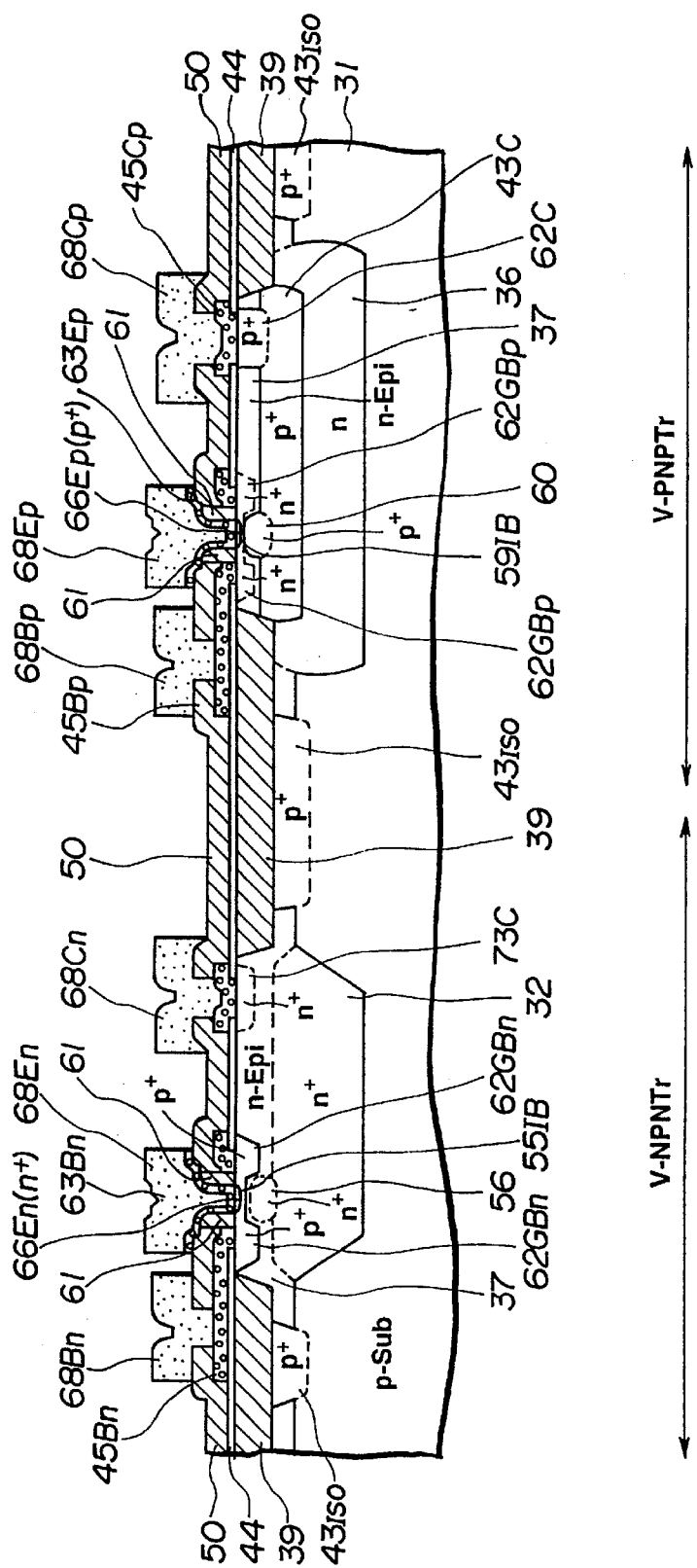

Then, as shown in FIG. 4E, an emitter window was opened by dry etching and the intrinsic base regions 55IB, 59IB and the pedestal regions 59, 60 were formed by ion implantation. The sidewall-forming $SiO_2$ film was applied to the entire substrate surface and graft base regions 62GB*n*, 62GB*p* and collector contact regions 73C, 62C were formed by annealing. Finally, the sidewall was formed by etch-back of the $SiO_2$ film.

Then, as shown in FIG. 4C, the second polysilicon layer was deposited on the entire substrate surface, and impurity was introduced into the second polysilicon layer. The emitter contact electrodes 63E*n* and 63E*p* were formed by patterning the second polysilicon layer and the contact hole was then formed by patterning the $SiO_2$ interlayer insulating film 50. Finally, the respective electrodes were formed by an Al-1% Si based multi-layer film.

The usual multi-layer metallization and passivation were then carried out to complete an IC.

In the present embodiment, the n-type epitaxial layer 37 could be reduced in thickness by suppressing upward diffusion from the n-type buried separating region 36 and the $p^+$ type buried collector region 43C, as in the previous embodiment. The merit of the present second embodiment resides in the fact that, since the ion implantation step for forming the n+ type collector contact region of V-NPNTr can be omitted, it becomes possible to eliminate one photomask and the step of forming the resist mask for ion implantation.

A third embodiment of the present invention is now explained.

In the present embodiment, the so-called double polysilicon base/emitter self-alignment structure of fabricating the base region and the emitter region in self-alignment by impurity diffusion from the two polysilicon layers is adopted only for the V-NPNTr, while the emitter region and the base region of V-PNPTr are formed in a transverse array by impurity diffusion from the second polysilicon layer by the so-called single polysilicon structure. The production process for the complementary bipolar transistor IC of the present embodiment is explained by referring to FIGS. 5A to 5I. The portions the present process has in common with the previous process are explained only briefly. The same numerals are used to depict the substrate and the films which are the same as those of the first embodiment.

Figure 5A:
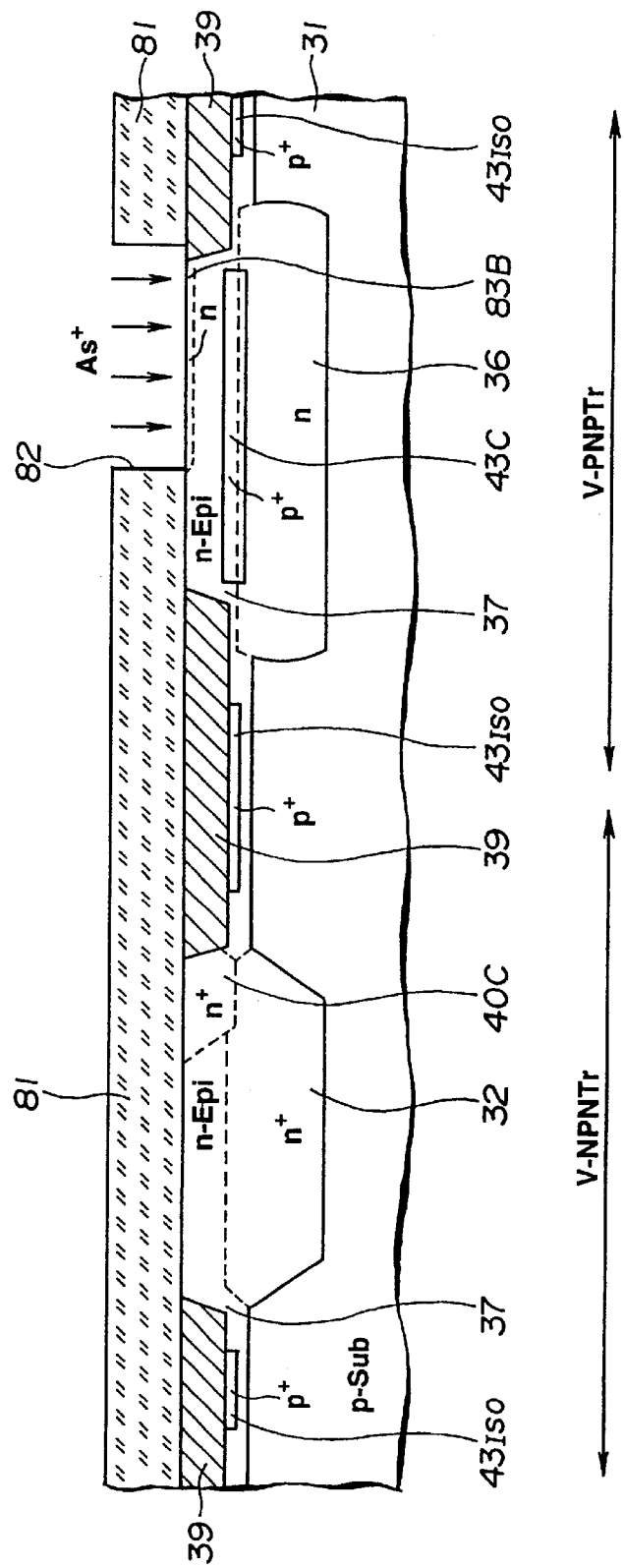

In the present process, the process up to formation of the p+ channel stop layer 43ISO and the buried collector region 43C is carried out in the same way as the first embodiment and a resist mask 81 having an opening 82 in register with the base/emitter forming region of V-PNPTr was formed as shown in FIG. 5A. Arsenic was then ion-implanted via the opening 82 for forming an n-type base region 83B. As the ion implantation conditions, the ion accelerating energy and the dosage were set to 20 to 100 keV and $1\times10^{13-14}/cm^2$, respectively.

Figure 5B:
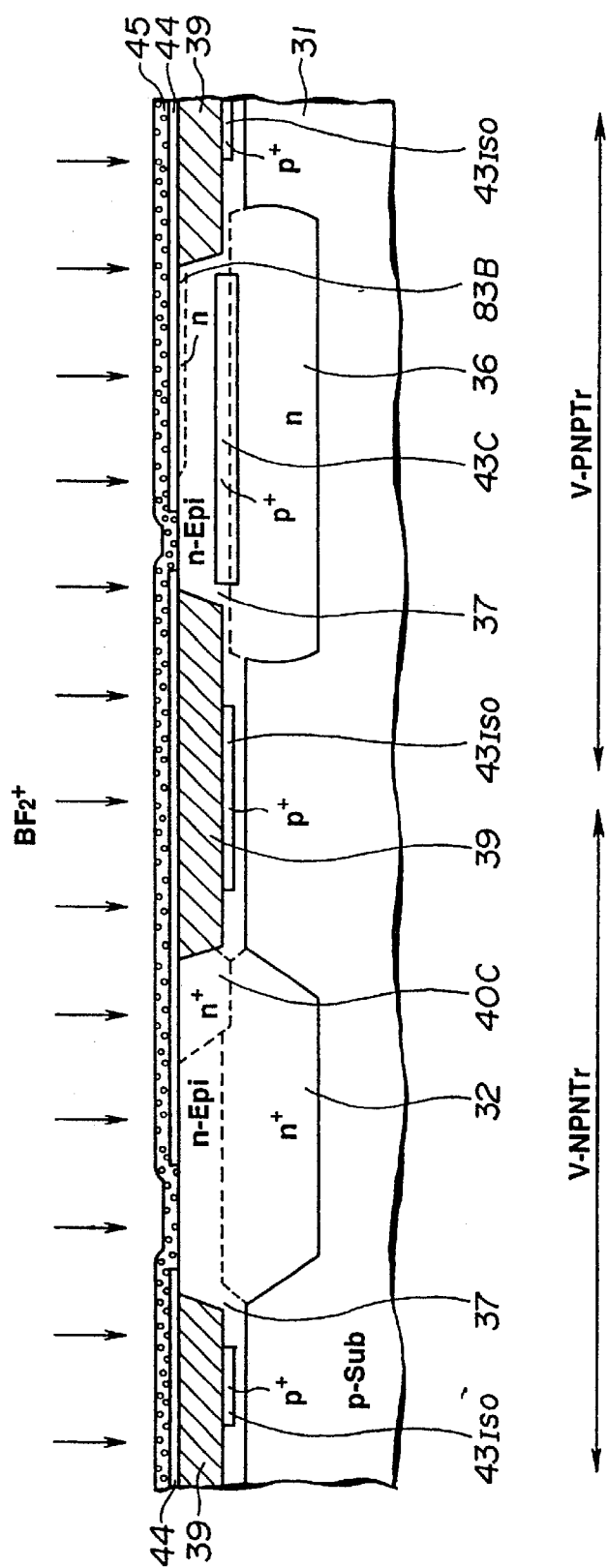

Then, as shown in FIG. 5B, the interlayer insulating film 44 was coated on the entire substrate surface and patterned and the first polysilicon layer 45 was coated on the entire substrate surface as in the first embodiment described above. Subsequently, boron ($BF^2$) was ion-implanted on the entire surface of the first polysilicon layer 45.

Figure 5C:
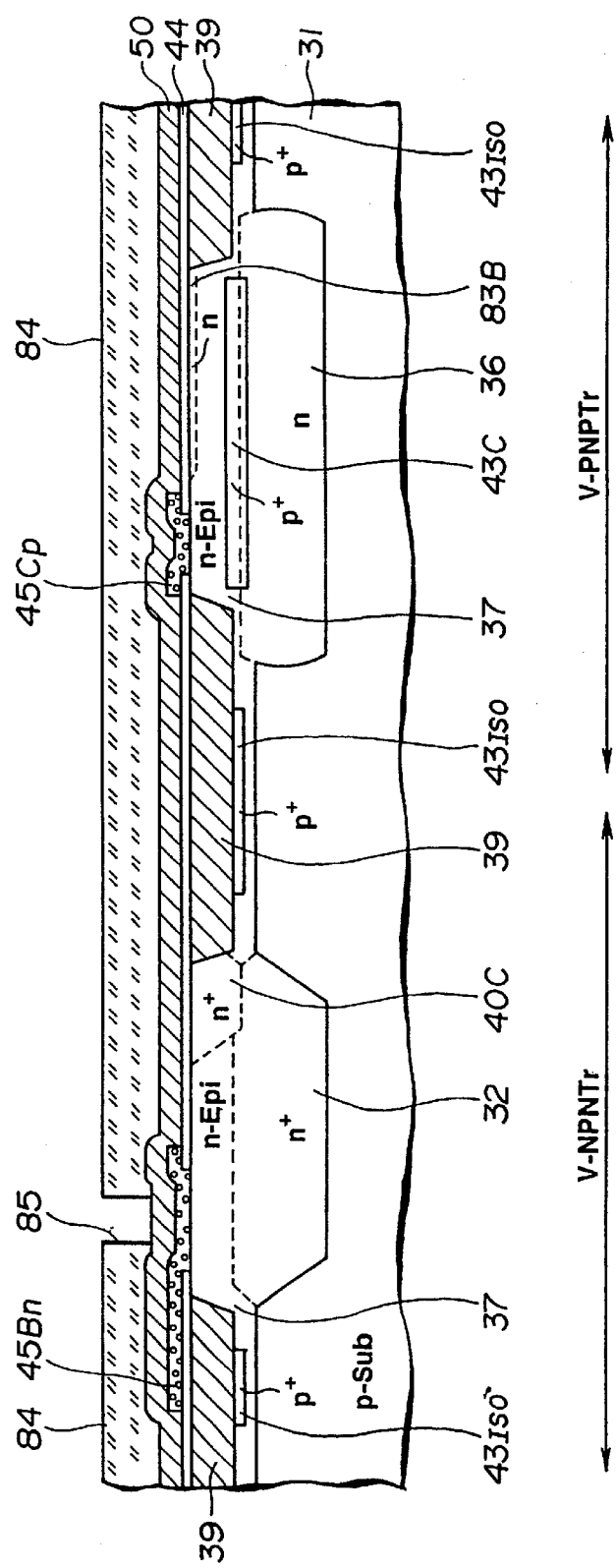

Then, as shown in FIG. 5C, the $SiO_2$ interlayer insulating film 50 was deposited on the entire substrate surface and a resist mask 84 having an opening 85 in register with the base/emitter forming region of V-NPNTr was formed.

Figure 5D:
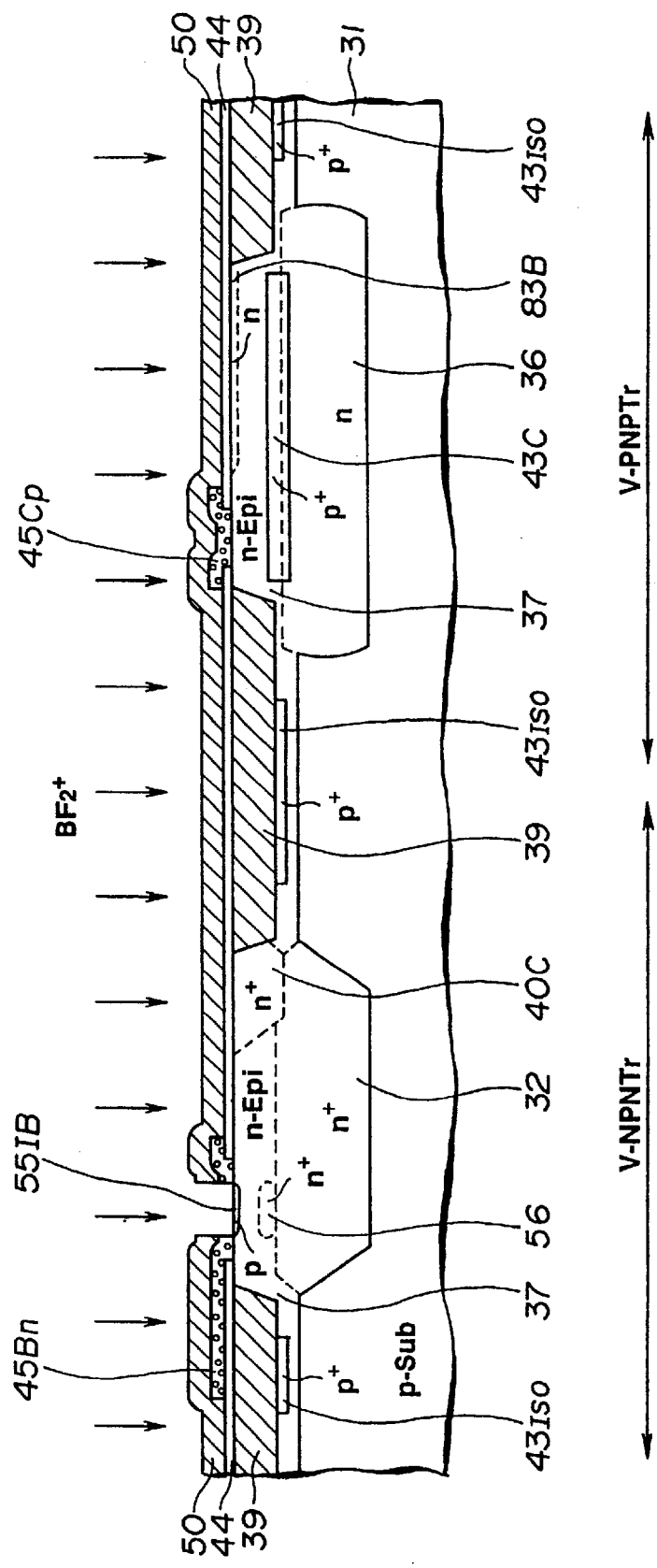

Then, as shown in FIG. 5D, a window was formed in the base/emitter forming region of V-NPNTr and boron was ion-implanted via the opening for forming the p-type intrinsic base region of V-NPNTr. In succession to this ion implantation, phosphorus ion implantation was carried out in a manner not shown for forming an n+ pedestal region 56.

Figure 5E:
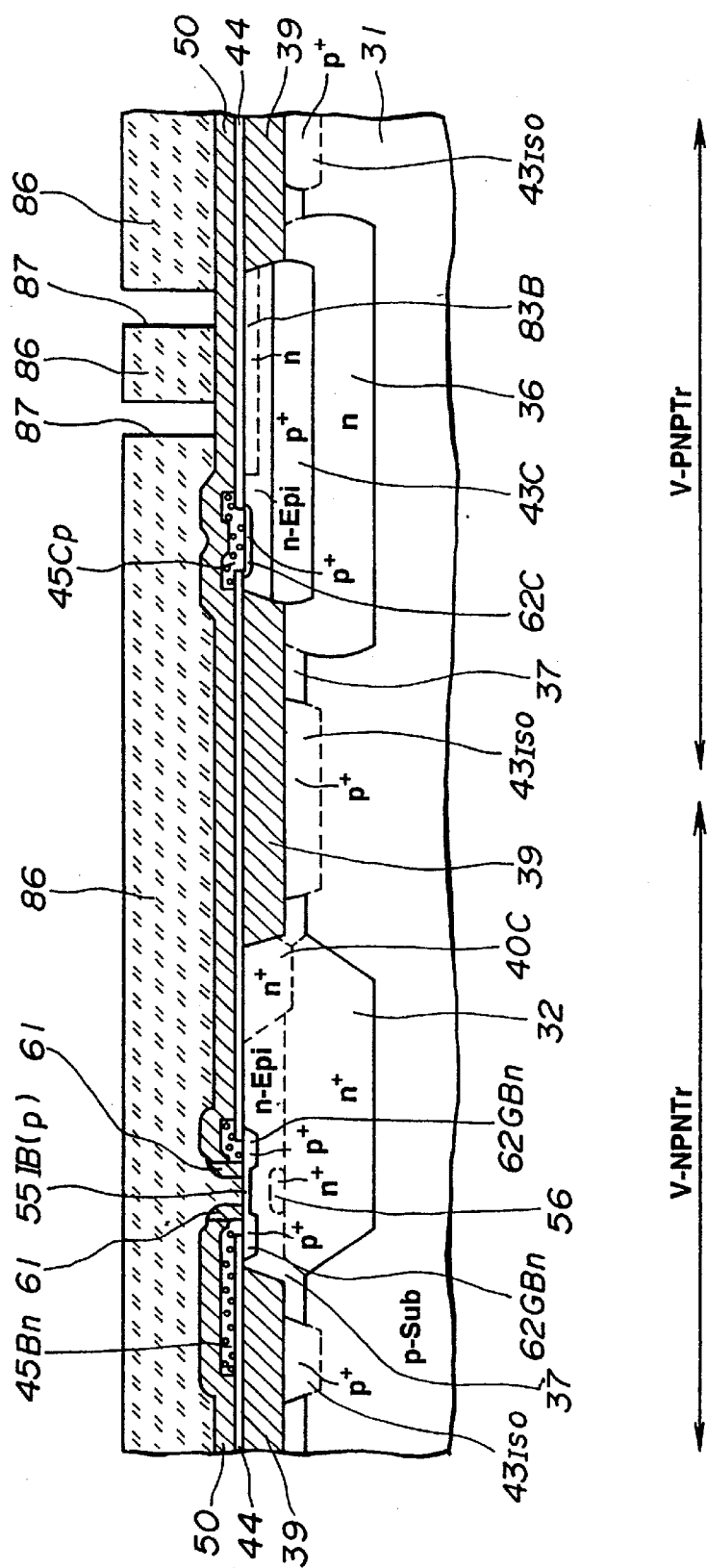

Then, as shown in FIG. 5E, a sidewall-forming $SiO_2$ was coated on the entire substrate surface and annealing was then carried out for forming a p+ type graft base region 62GBn of V-NPNTr and a p+ type collector contact region 62C of V-PNPTr simultaneously. The $SiO_2$ was then etched back to form a sidewall 61.

A resist mask 86 having an opening 87 was then formed in the $SiO_2$ interlayer insulating films 50, 44 for forming contact holes facing the emitter forming region and the base contact electrode forming region of V-PNPTr.

Figure 5F:
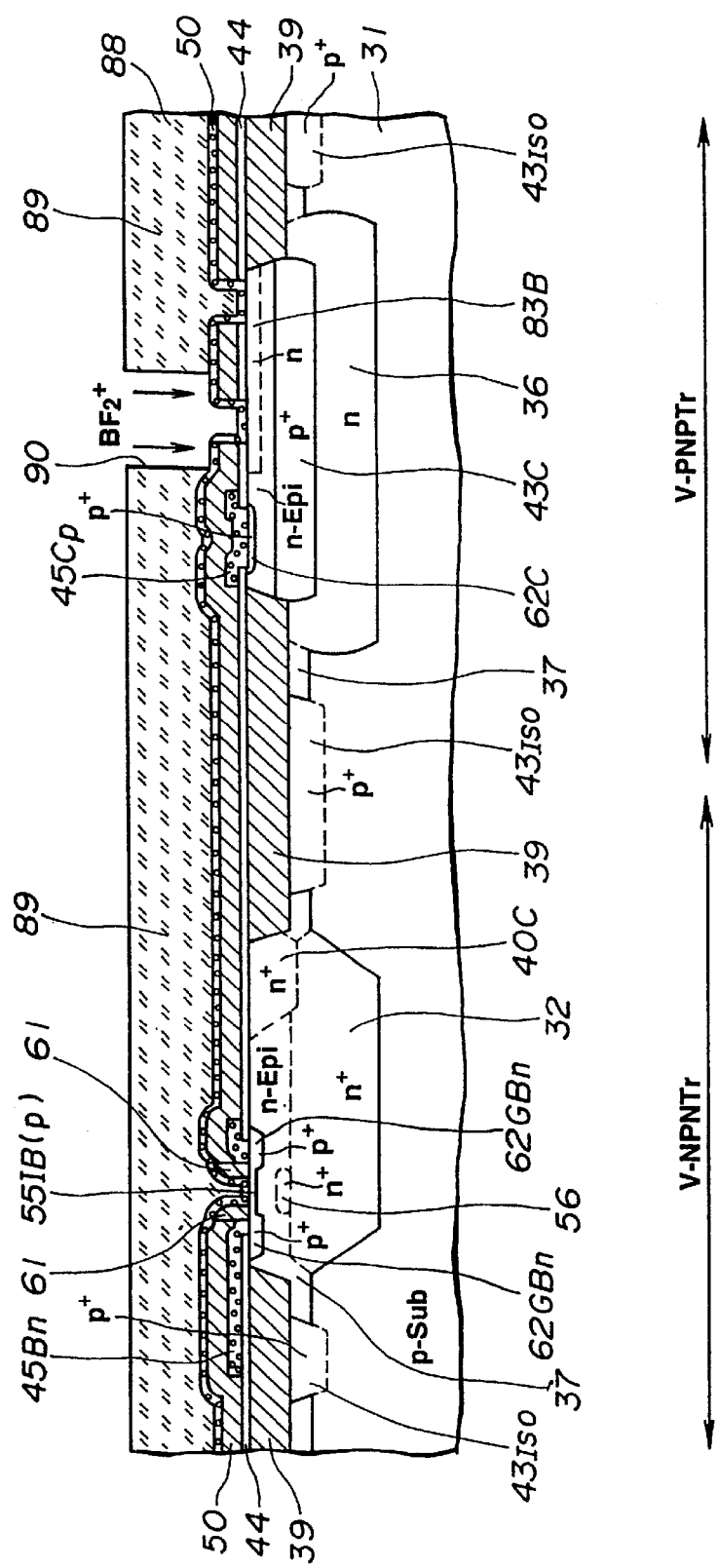

Then, as shown in FIG. 5F, the $SiO_2$ interlayer insulating films 50, 44 were dry-etched via the opening 87 for forming contact holes.

A second polysilicon layer 88 was then deposited on the entire substrate surface. Then, for introducing the p-type impurity into the region of the second polysilicon layer 88 which later becomes the emitter contact electrode of V-PNPTr, indicated by numeral 88Ep of FIG. 5H, a resist mask 89 having an opening 90 was formed on the second polysilicon layer 88 for carrying out boron ion implantation.

Figure 5G:
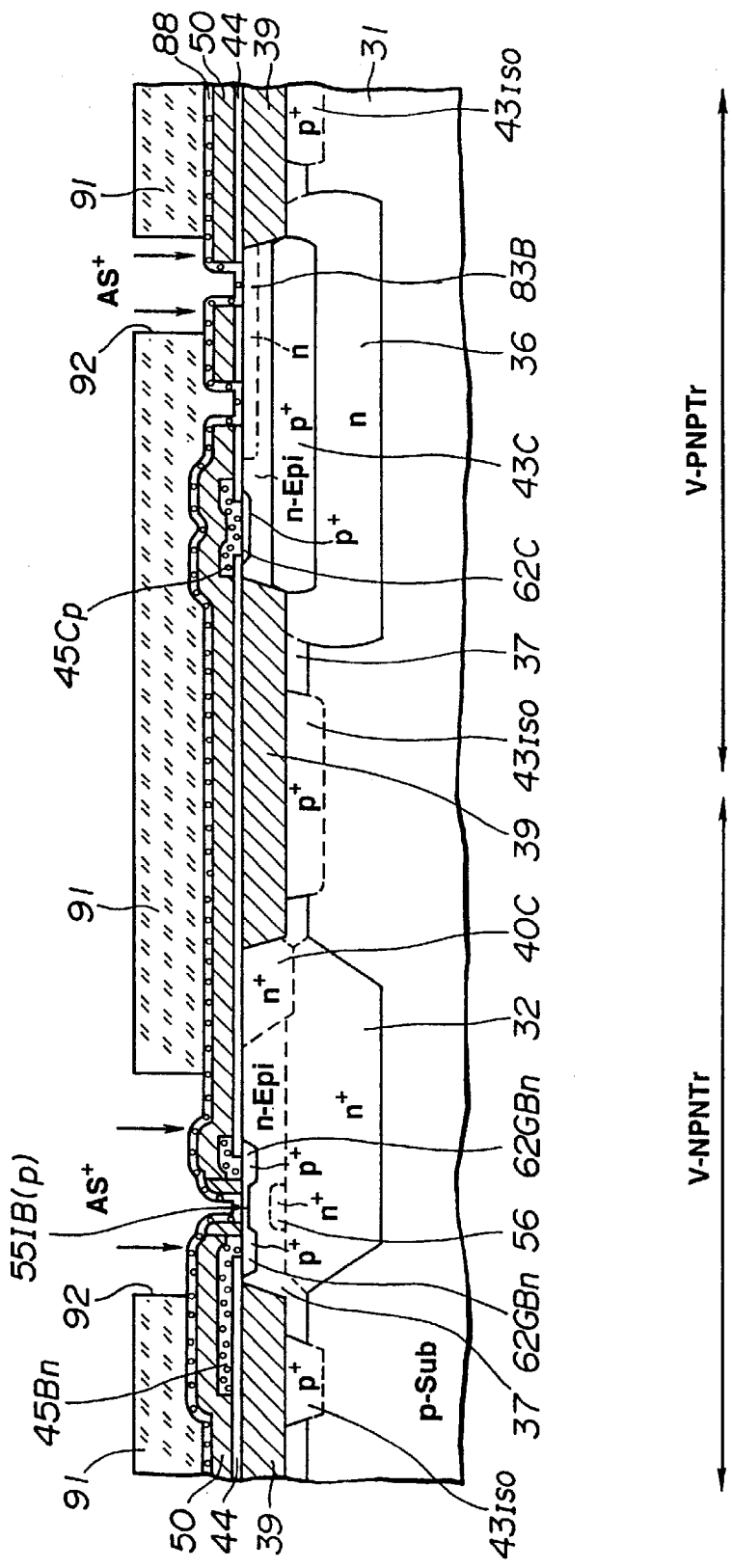

Then, as shown in FIG. 5G, for introducing n-type impurities into the region of the second polysilicon layer 88 which later becomes the emitter contact region of V-NPNTr indicated by numeral 88Ep of FIG. 5H, a resist mask 89 having an opening 90 was formed on the second polysilicon layer 88 for boron ion implantation.

Then, as shown in FIG. 5G, for introducing n-type impurity into a region of the second polysilicon layer 88 which later becomes the emitter contact electrode 88En of FIG. 5H, and the base contact electrode of V-PNPTr indicated by 88Ep of FIG. 5H, arsenic was ion-implanted into the second polysilicon layer 88.

Figure 5H:
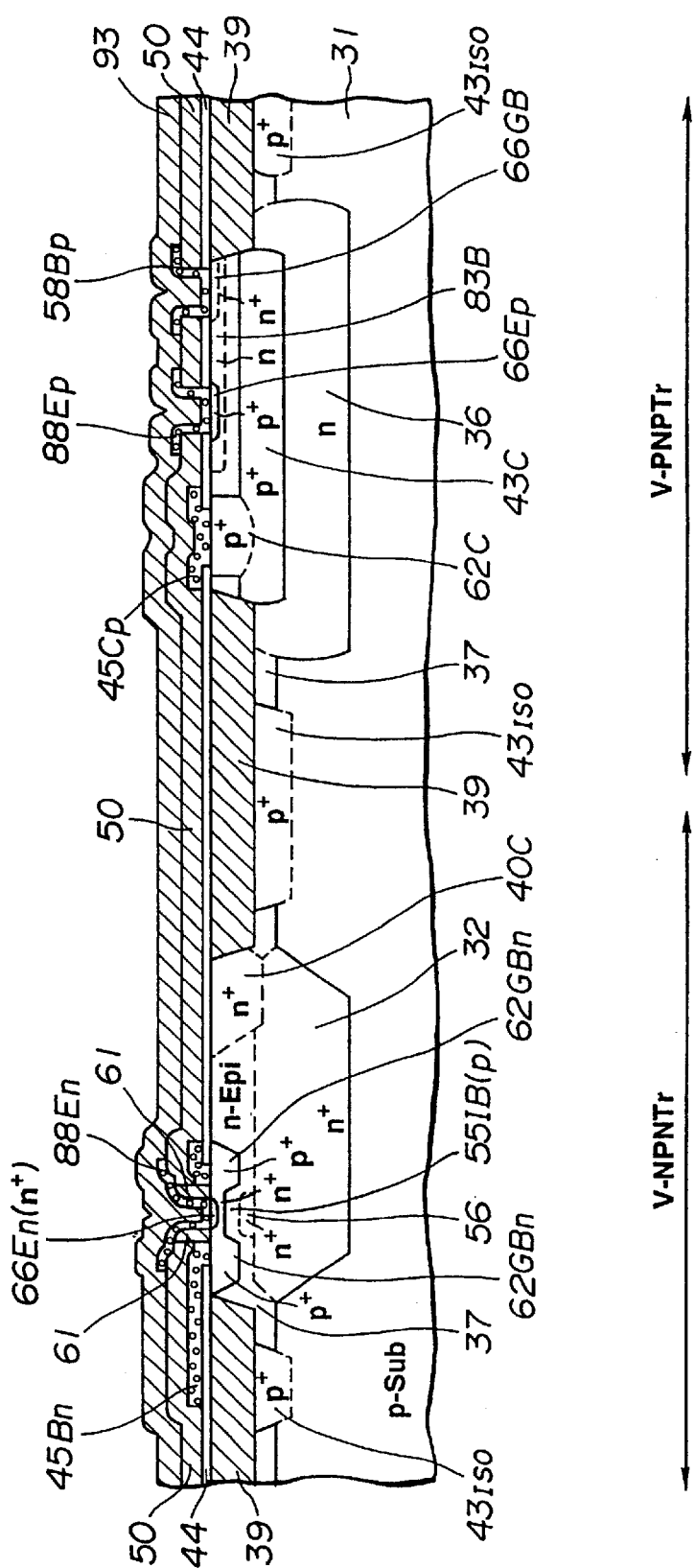

The, as shown in FIG. 5H, the second polysilicon layer 88 was patterned for forming an emitter contact electrode 88En of V-NPNTr and an emitter contact electrode 88Ep and a base contact electrode 88Ep of V-PNPTr. The entire substrate surface was then coated with an $SiO_2$ interlayer insulating film 93 and annealing was then carried out for simultaneously forming an n+ type emitter region 66En of V-PNPTR and a p emitter region 66Ep and an n+ emitter electrode 66Ep of V-NPNTr.

Figure 5I:
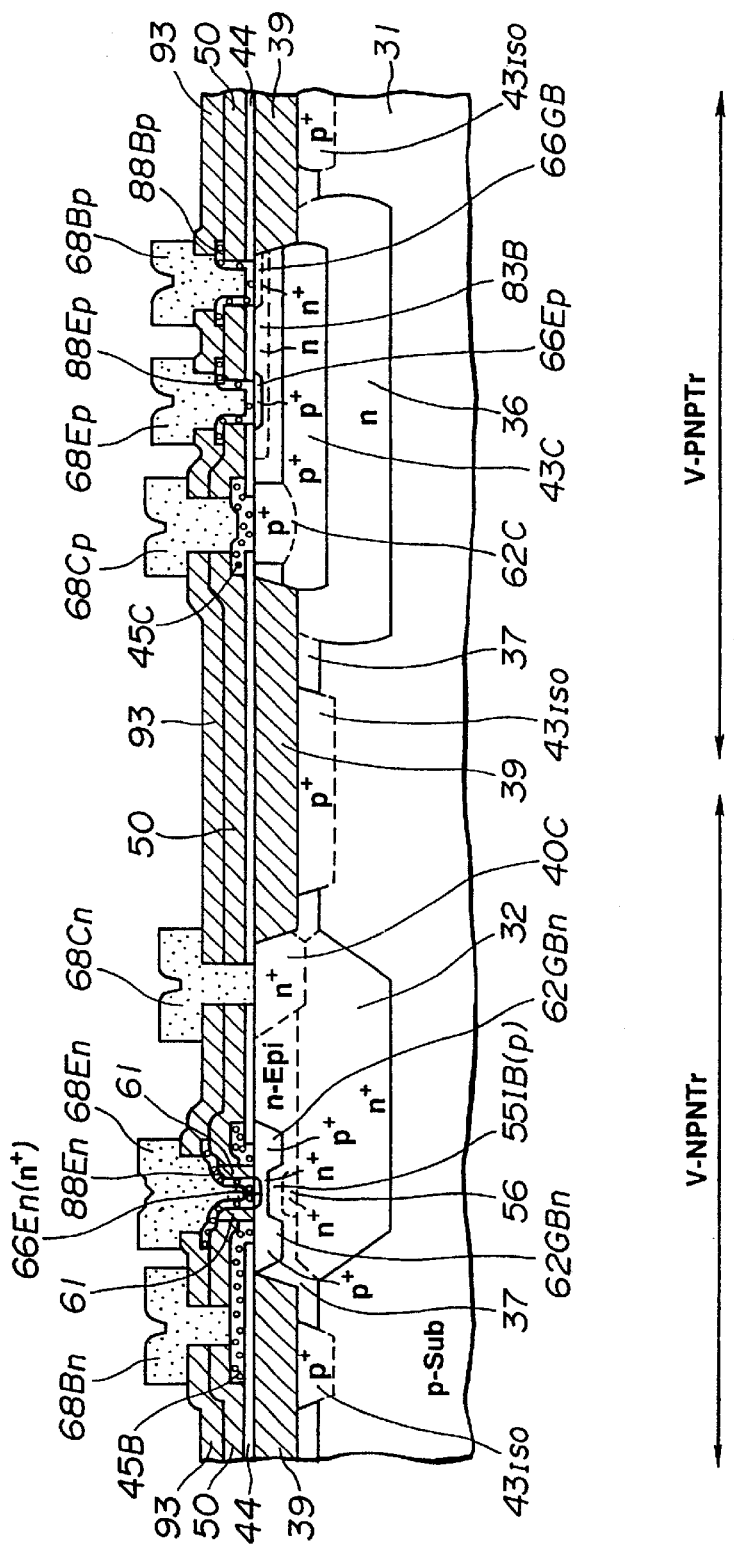
FIG. 5I is a schematic cross-sectional view showing the state in which a contact hole has been formed by patterning the SiO interlayer insulating film of FIG. 5H and an upper layer metallization has been formed.

Then, as shown in FIG. 5I, contact holes were formed in the $SiO_2$ interlayer insulating films 93, 50, at the same time as the respective electrodes were formed by Al-based layered films.

In the present embodiment, the n-type epitaxial layer 37 could similarly be reduced in thickness by suppressing the n-type buried separating region 36 and the p+ buried collector region 43C. The merit of the present embodiment resides in that the self-alignment structure is not adopted in the base/emitter region of V-PNPTr for reducing the number of photomasks and the number of process steps.

Although the present invention has been described with reference to three embodiments, the present invention is not limited to these embodiments and may be suitably modified in connection with the design rule, process conditions and details of the IC structures.

A fourth embodiment of the present invention is explained.

In the present embodiment., the so-called double polysilicon base/emitter self-alignment structure of fabricating the base region and the emitter region in self-alignment by impurity diffusion from the two polysilicon layers is adopted only for the V-NPNTr, while the emitter region and the collector contact region of V-PNPTr are formed by impurity diffusion from the second polysilicon layer by so-called single polysilicon structure. The production process for the complementary bipolar transistor IC of the present embodiment is explained by referring to FIGS. 6A to 6H. The portions the present process has in common with the previous process are explained only briefly. The same numerals are used to depict the substrate and the films which are the same as those of the first embodiment.

Figure 6A:
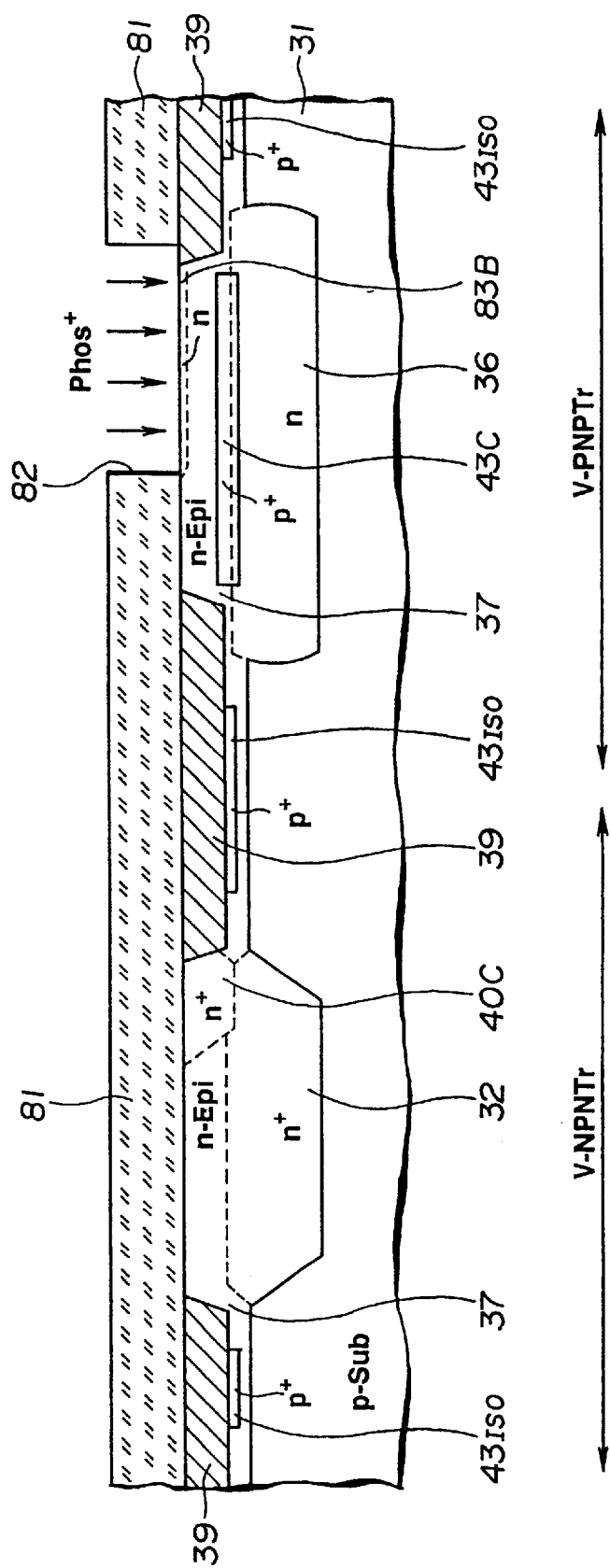

In the present process, the process up to formation of the p+ channel stop layer 43ISO and the buried collector region 43C was carried out in the same way as in the first embodiment and a resist mask 81 having an opening 82 in register with the base/emitter forming region of V-PNPTr was formed as shown in FIG. 6A. Phosphorus was then ion-implanted via an opening 82 for forming an n-type base region 83B. As the ion implantation conditions, the ion accelerating energy and the dosage were set to 100 to 200 keV and $1\times10^{13-14}/cm^2$, respectively.

Figure 6B:
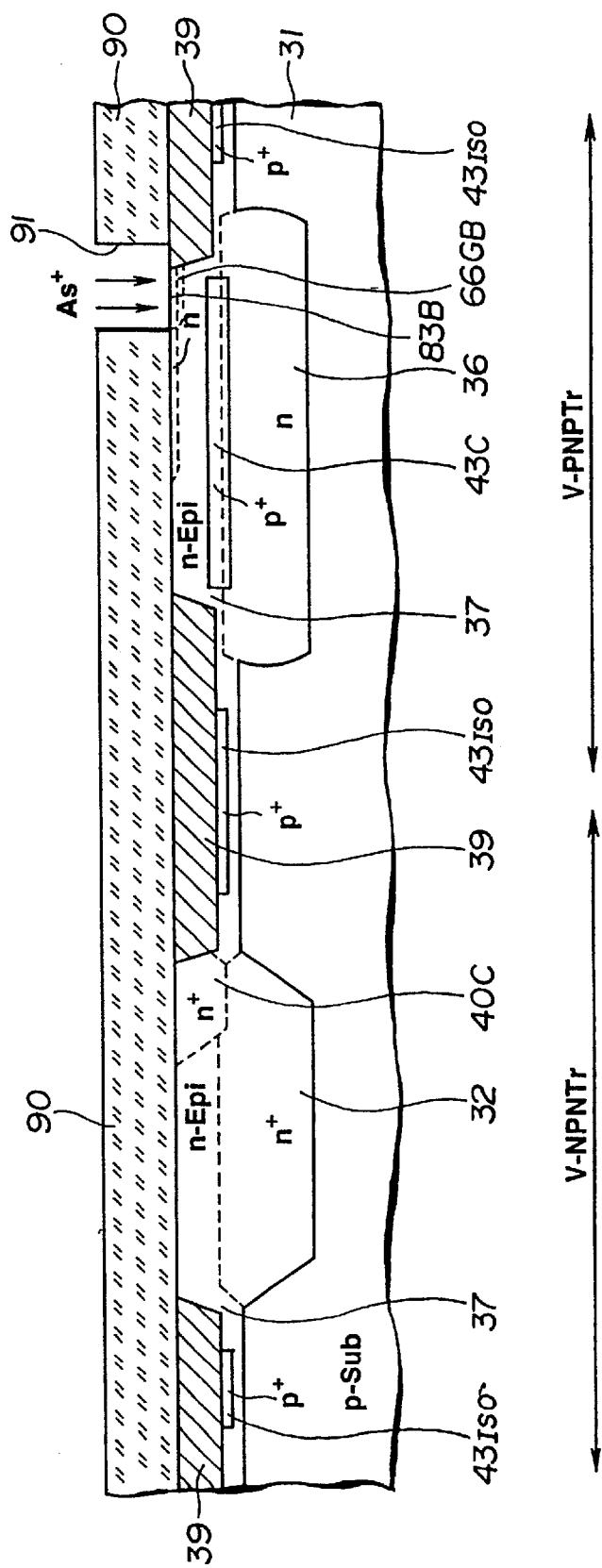

Then, as shown in FIG. 6B, a resist mask 90 having an opening 91 in register with the base contact region of V-PNPTr was formed and arsenic was ion-implanted via the opening 91 for forming the n+ graft base region 66GB. As the ion implantation conditions, the ion accelerating energy and the dosage were set to 20 to 100 keV and $1\times10^{15-16}/cm^2$, respectively.

Figure 6C:
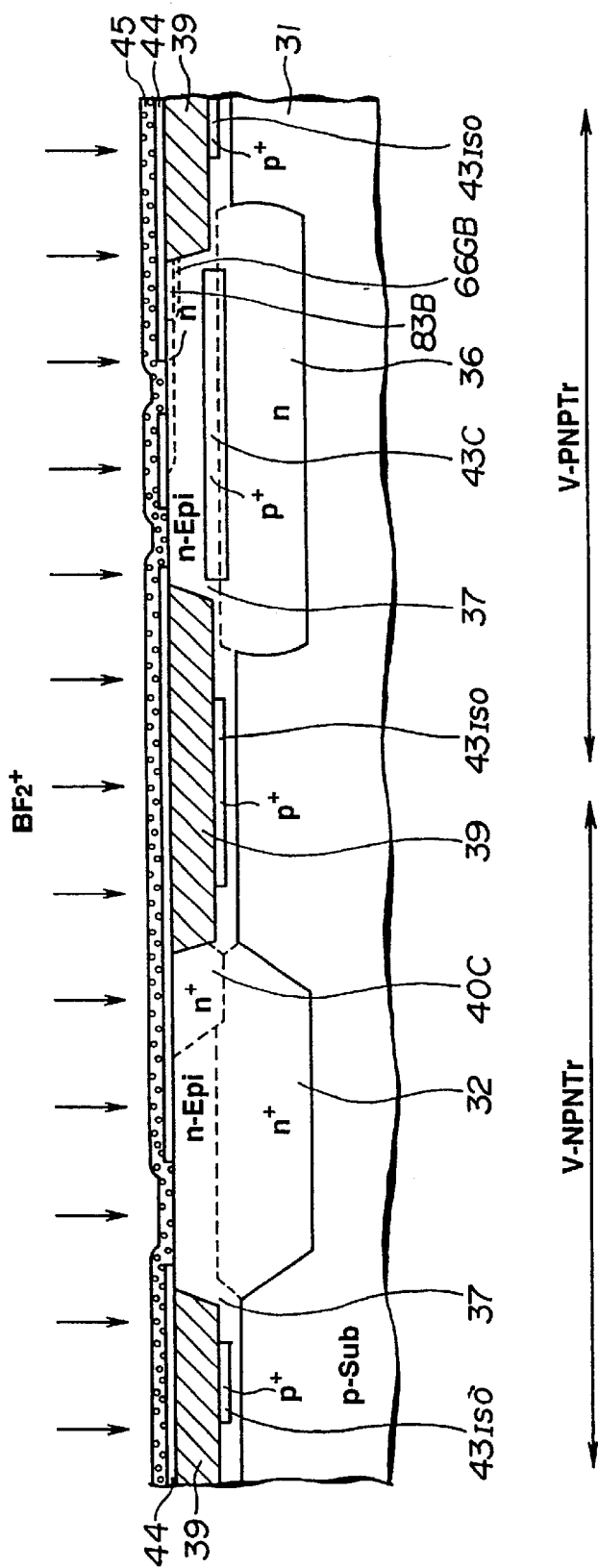

Then, as shown in FIG. 6C, the $SiO_2$ interlayer insulating film 44 was deposited on the entire substrate surface and patterned and the first polysilicon layer 45 was deposited on the entire substrate surface, as in the first embodiment. Boron ($BF_2^+$) was then ion-implanted on the entire surface of the first polysilicon layer 45.

Figure 6D:
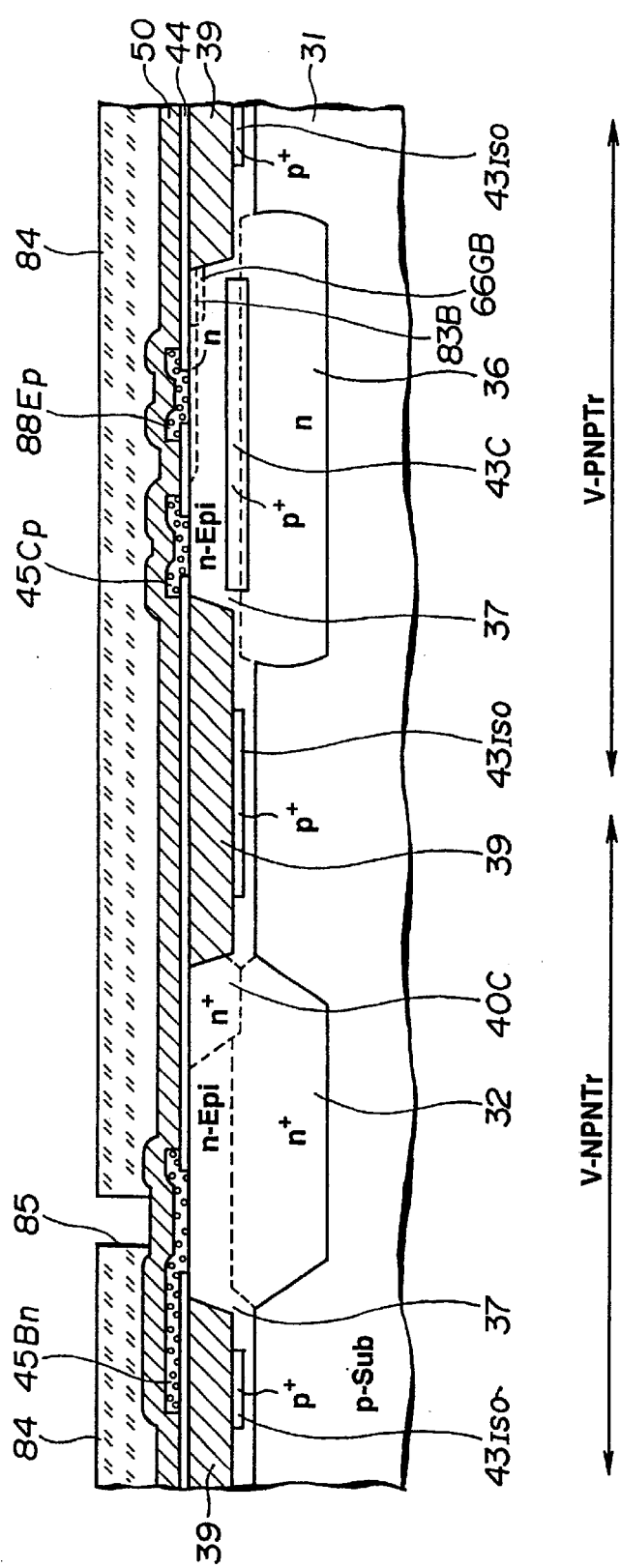

The first polysilicon layer 45 was then patterned for forming a base contact region 45B$n$ of V-NPNTr and a collector contact electrode 45C$p$ and an emitter contact electrode 45E$p$ of V-PNPTr, as shown in FIG. 6D. An $SiO_2$ interlayer insulating film 50 was then deposited on the entire substrate surface and a resist mask 84 having an opening 85 in register with the base-emitter forming region of V-NPNTr was formed.

Figure 6E:
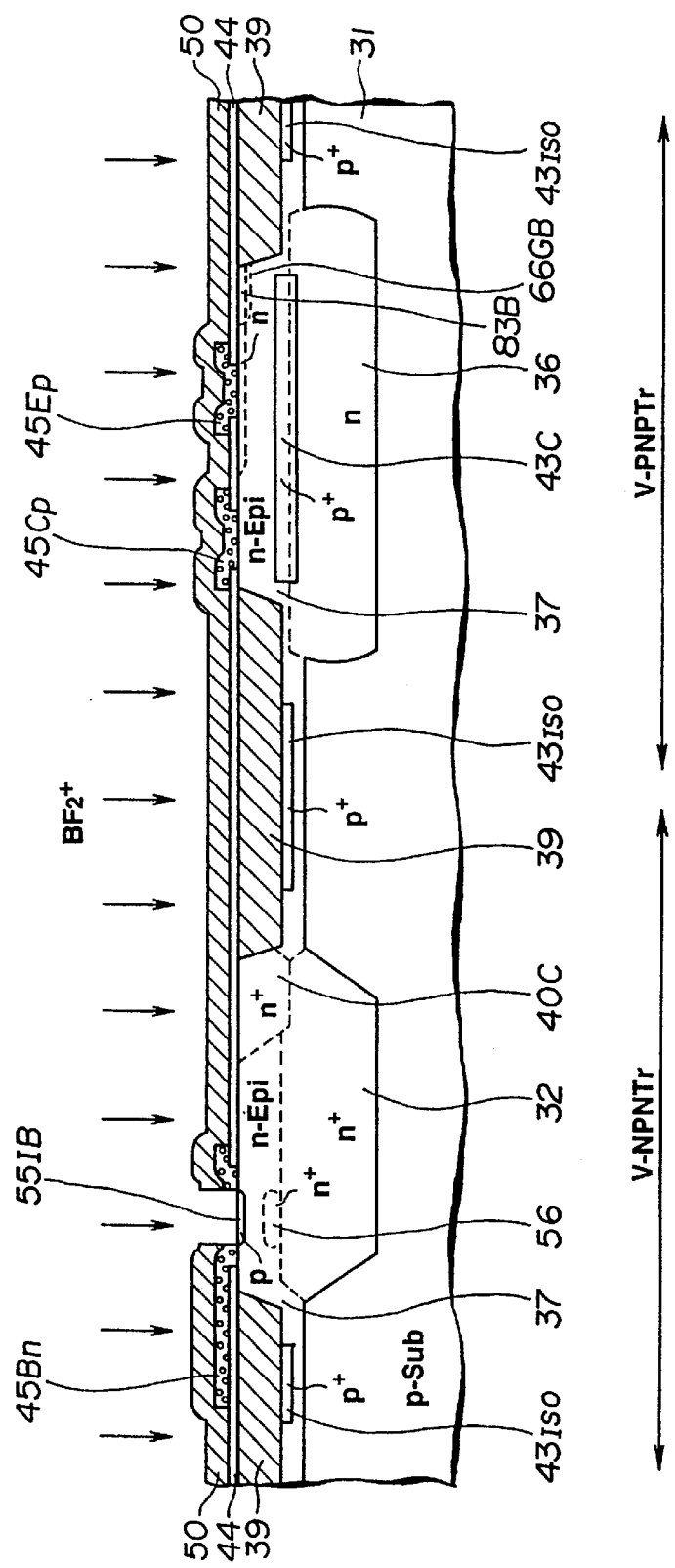

Then, as shown in FIG. 6E, a window was formed in the base-emitter forming region of V-NPNTr, and boron ion implantation was carried out for forming a p-type intrinsic base region 55IB of V-NPNTr. Phosphorus ions were implanted in succession for forming an n+ type pedestal region 56.

Figure 6F:
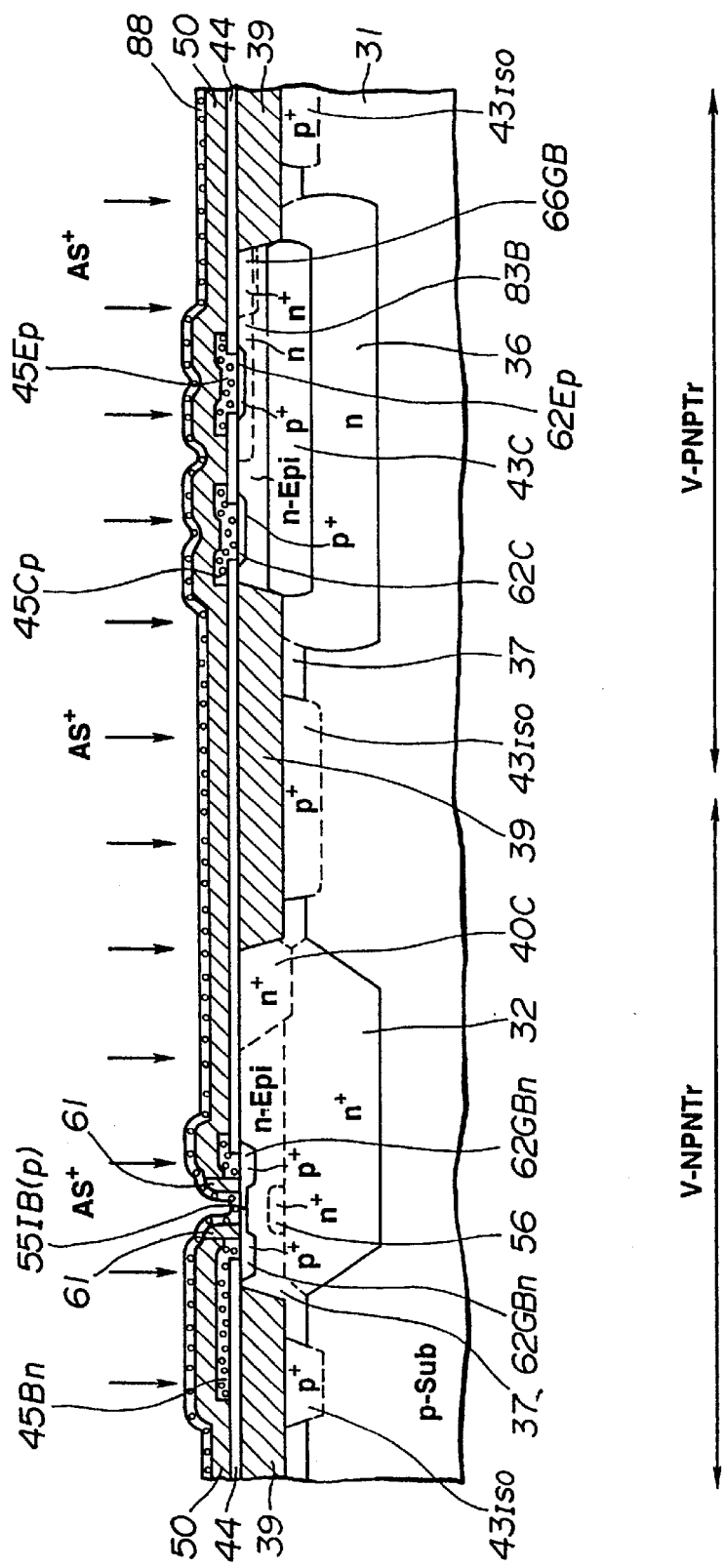

Then, as shown in FIG. 6F, a-sidewall-forming $SiO_2$ film was deposited on the entire substrate and annealing was then carried out for simultaneously forming a p+ graft base region 62GB$n$ of V-NPNTr and a p+ type collector contact region 62C of V-PNPTr. The $SiO_2$ was also etched back for forming a sidewall 61.

A second polysilicon layer 88 was then deposited on the entire substrate surface. Then, arsenic was ion-implanted into the entire surface of the second polysilicon layer 88 for forming the emitter region of V-NPNTr.

Figure 6G:
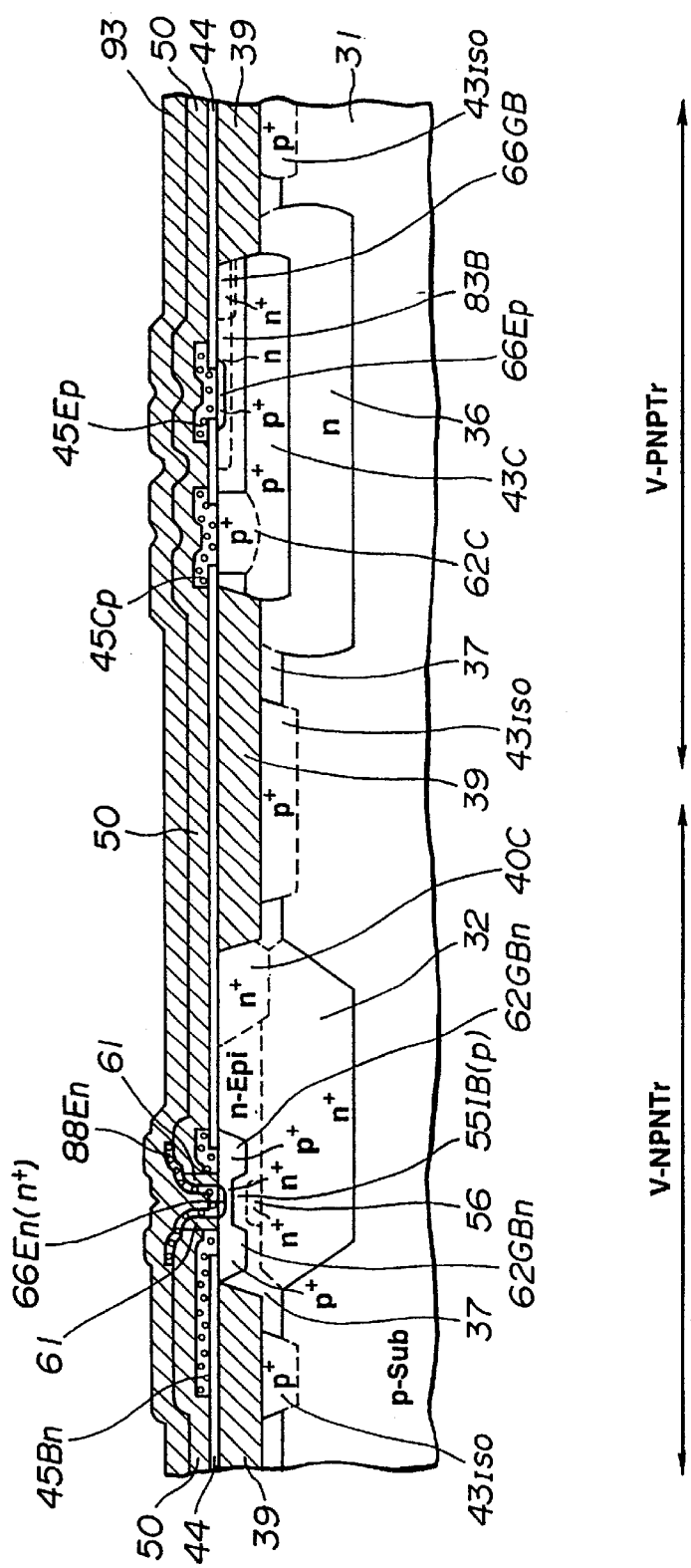

Then, as shown in FIG. 6G, the second polysilicon layer 88 was patterned for forming an emitter contact electrode 88E$n$ of V-NPNTr. The entire substrate surface was then covered with an $SiO_2$ interlayer insulating film 93 and annealing was then carried out for forming an n+ emitter region 66E$n$ of V-NPNTr.

Figure 6H:
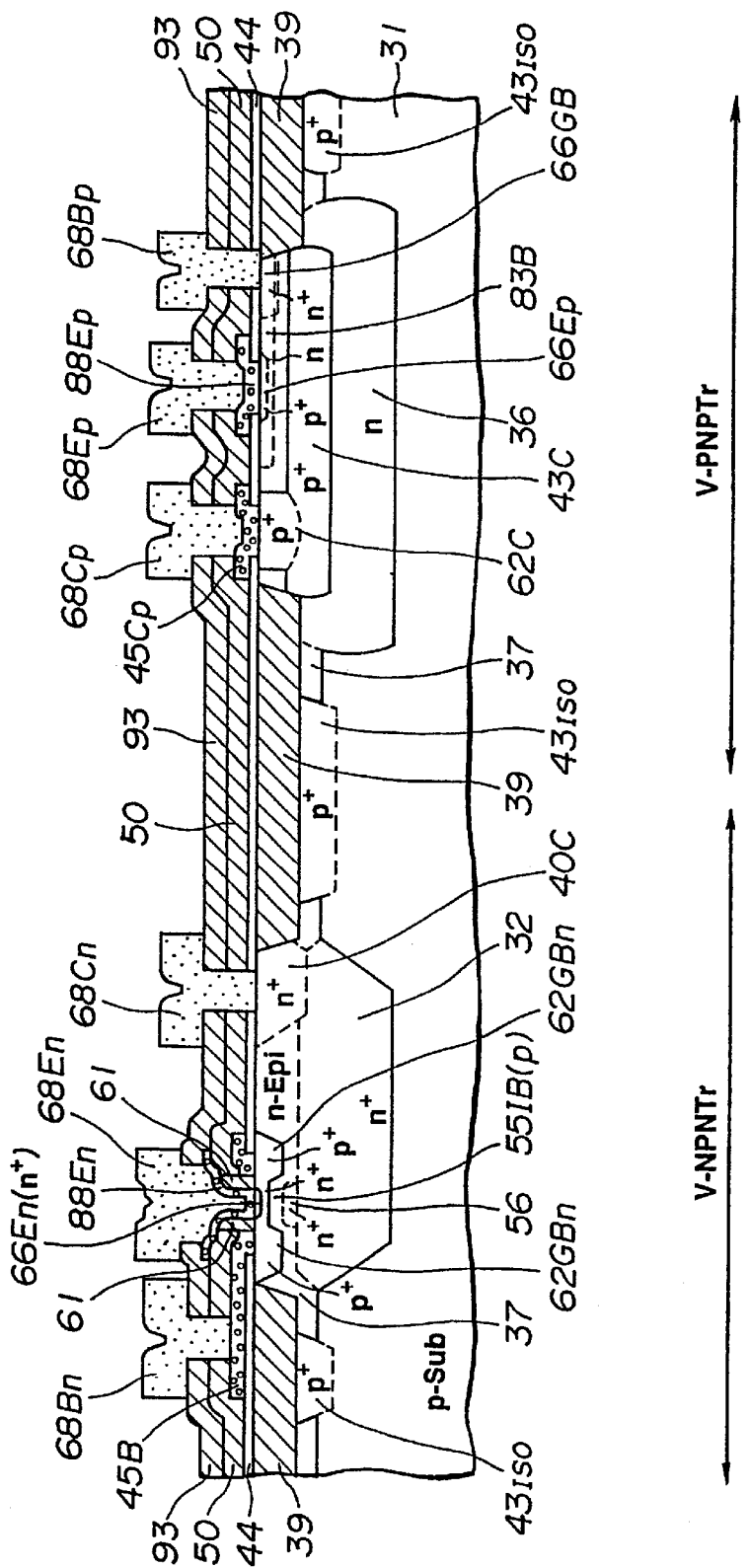

Then, as shown in FIG. 6H, the $SiO_2$ interlayer insulating films 93, 50 were dry-etched for forming contact holes and respective electrodes were formed by Al-based layered films as in the first embodiment described above.

In the present embodiment, the n-type epitaxial layer 37 could similarly be reduced in thickness by suppressing upward diffusion from the n-type buried separating region 36 and the p+ buried collector region 43C. The merit of the present embodiment resides in that the emitter region of the V-PNPTr and the base contact region of the V-NPNTr are formed simultaneously for reducing the number of photomasks and the number of process steps.

Although the present invention has been described with reference to four embodiments, the present invention is not limited to these embodiments and, as an example, the p+ type graft base region of the V-NPNTr and the emitter region of the V-PNPTr may be formed simultaneously by ion implantation. In addition, the present invention may be suitably modified in connection with the design rule, process conditions and details of the IC structures.

What is claimed is:

1. A semiconductor device in which a vertical NPN transistor and a vertical PNP transistor electrically isolated from each other are formed on a p-type semiconductor substrate, comprising:

an n type epitaxial layer formed on said substrate;

an n-type buried separating region of said vertical PNP transistor formed in said substrate;

a p-type buried collector region of said vertical PNP transistor formed in said n-type buried separating region;

an n-type buried collector region of said vertical NPN transistor formed in said epitaxial layer, base regions and emitter regions of said vertical NPN and PNP transistor formed in said epitaxial layer, a graft base region electrically connected to said base region of said vertical NPN transistor, a base contact electrode of said NPN transistor electrically connected to said base region of said vertical NPN transistor, a collector contact electrode of said PNP transistor electrically connected to said collector region of said vertical PNP transistor, wherein an n-type buried separating region of said vertical PNP transistor is formed by ion implantation subsequently to formation of said n-type buried collector region of said vertical NPN transistor, and wherein a p-type buried collector region of said vertical PNP transistor is formed subsequently to formation of an n-type epitaxial layer, and wherein said base contact electrode of said NPN transistor and said collector contact electrode of said PNP transistor is the same semiconductor layer including the same impurity.

2. A semiconductor device in which avertical NPN transistor and a vertical PNP transistor electrically isolated from each other are formed on a p-type semiconductor substrate, comprising:

an n-type epitaxial layer formed on said substrate, an n-type buried separating region of said vertical PNP transistor formed in said substrate, a p-type buried collector region of said vertical PNP transistor formed in said n-type buried separating region, an n-type buried collector region of said vertical vertical NPN transistor and PNP transistor formed in said epitaxial layer, base regions and emitter regions of said vertical NPN and PNP transistor formed in said epitaxial layer, a graft base region electrically connected to said base region of said vertical NPN transistor a base contact electrode of said NPN transistor electrically connected to said base region of said vertical NPN transistor, a collector contact electrode of said PNP transistor electrically connected to said collector region of said vertical PNP transistor, wherein an n-type buried separating region of said vertical PNP transistor is formed by ion implantation prior to formation of said n-type buried collector region of said vertical NPN transistor and, wherein a p-type buried collector region of said vertical PNP transistor is formed subsequently to formation of an n-type epitaxial layer, and wherein said base contact electrode of said NPN transistor and said collector contact electrode of said PNP transistor is the same semiconductor layer including the same impurity.

3. The semiconductor device as claimed in claim 1, further comprising:

a collector contact region of said PNP transistor electrically connected to said collector region and said collector contact electrode of said PNP transistor, wherein said graft base region of said NPN transistor and said collector contact region of said PNP transistor is the same semiconductor layer including the same impurity.

4. The semiconductor device as claimed in claim 2, further comprising:

a collector contact region of said PNP transistor electrically connected to said collector region and said collector contact electrode of said PNP transistor, wherein said graft base region of said NPN transistor and said collector contact region of said PNP transistor is the same semiconductor layer including the same impurity.

5. The semiconductor device as claimed in claim 1, wherein the ion implantation is carried out at an ion acceleration energy of not less than 300 keV.

6. The semiconductor device as claimed in claim 1, wherein ion implantation is carried out with a projection range of not less than 0.4 $\mu$m.

* * * * *

UNITED STATES PATENT AND TRADEMARK OFFICE
CERTIFICATE OF CORRECTION

PATENT NO.    : 6,222,250 B1
DATED         : April 24, 2001
INVENTOR(S)   : Takayuki Gomi It is certified that error appears in the above-identified patent and that said Letters Patent is hereby corrected as shown below:

Column 17,
Line 66, change "n type" to -- n-type --.

Column 18,
Line 39, delete "vertical" (second occurrence).

Signed and Sealed this

Twenty-fifth Day of March, 2003

JAMES E. ROGAN
*Director of the United States Patent and Trademark Office*